United States Patent
Luo et al.

(10) Patent No.: US 9,058,885 B2
(45) Date of Patent: Jun. 16, 2015

(54) MAGNETORESISTIVE DEVICE AND A WRITING METHOD FOR A MAGNETORESISTIVE DEVICE

(71) Applicant: Agency for Science, Technology and Research, Singapore (SG)

(72) Inventors: Yuanhong Luo, Singapore (SG); Gerard Franck Ernult, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/708,866

(22) Filed: Dec. 7, 2012

(65) Prior Publication Data

US 2013/0148418 A1    Jun. 13, 2013

Related U.S. Application Data

(60) Provisional application No. 61/567,648, filed on Dec. 7, 2011, provisional application No. 61/588,205, filed on Jan. 19, 2012.

(51) Int. Cl.
| | |
|---|---|
| G11C 11/00 | (2006.01) |
| G11C 11/16 | (2006.01) |
| H01L 43/02 | (2006.01) |
| H01L 43/08 | (2006.01) |
| H01L 43/10 | (2006.01) |
| H01F 10/32 | (2006.01) |

(52) U.S. Cl.
CPC ............ *G11C 11/1675* (2013.01); *H01L 43/02* (2013.01); *G11C 11/161* (2013.01); *H01L 43/08* (2013.01); *H01L 43/10* (2013.01); *H01F 10/3254* (2013.01); *H01F 10/3263* (2013.01); *H01F 10/3286* (2013.01)

(58) Field of Classification Search
CPC ............ G11C 11/161; G11C 11/1675; G11C 11/5607
USPC .......................................................... 365/158
See application file for complete search history.

(56) References Cited

U.S. PATENT DOCUMENTS

| 8,331,141 B2* | 12/2012 | Shukh ............................ 365/173 |
| 2008/0094886 A1* | 4/2008 | Ranjan et al. .................. 365/171 |
| 2008/0112087 A1* | 5/2008 | Clinton et al. ................. 360/317 |
| 2014/0042571 A1* | 2/2014 | Gan et al. ....................... 257/421 |

OTHER PUBLICATIONS

Wei-Gang Wang, et al., "Electric-Field-Assisted Switching in Magnetic Tunnel Junctions", Nature Materials, vol. 11, pp. 64-68, (Jan. 2012).

\* cited by examiner

*Primary Examiner* — Anthan Tran
(74) *Attorney, Agent, or Firm* — Blakely, Sokoloff, Taylor & Zafman LLP

(57) ABSTRACT

A magnetoresistive device including a fixed magnetic layer structure, a first free magnetic layer structure, and a second free magnetic layer structure, wherein the fixed magnetic layer structure is arranged in between the first free magnetic layer structure and the second free magnetic layer structure, wherein the magnetization orientation of the first free magnetic layer structure is variable in response to a first electrical signal of a first polarity and the magnetization orientation of the second free magnetic layer structure is at least substantially non-variable in response to the first electrical signal, and wherein the magnetization orientation of the second free magnetic layer structure is variable in response to a second electrical signal of a second polarity and the magnetization orientation of the first free magnetic layer structure is at least substantially non-variable in response to the second electrical signal, wherein the second polarity is opposite to the first polarity.

18 Claims, 9 Drawing Sheets

───── without voltage pulse
▪▪▪▪▪▪▪ with applied smaller voltage pulse
▬ ▪ ▬ with applied bigger voltage pulse

MAGNETORESISTIVE DEVICE AND A WRITING METHOD FOR A MAGNETORESISTIVE DEVICE

CROSS-REFERENCE TO RELATED APPLICATIONS

This application claims the benefit of priority of U.S. provisional application No. 61/567,648, filed 7 Dec. 2011, and U.S. provisional application No. 61/588,205, filed 19 Jan. 2012, the contents being hereby incorporated by reference in their entireties for all purposes.

TECHNICAL FIELD

Various embodiments relate to a magnetoresistive device and a writing method for a magnetoresistive device.

BACKGROUND

Non-volatile memories usage is widely spreading as they allow reduction of the power consumption of the memory chips, due to the fact that no data refreshing is required. Flash memory is currently being used in a wide variety of devices but suffers from a limited endurance and slow writing times.

Different types of memories are now being intensively developed to overcome these limitations. Among them, Phase Change Random Access Memories (PCRAM) and Magnetic Random Access Memories (MRAM) have been identified by the International Technology Roadmap for Semiconductors (ITRS) as the most adequate for Flash memory replacement.

Typical MRAM structure is based on magnetic tunnel junctions using ferromagnetic materials separated by a thin insulator barrier through which electrons will flow by tunnel effect. One of the ferromagnetic material has its magnetization pinned (so-called pinned layer) while the second ferromagnetic layer is set so that its magnetization can be switched (free layer) from a direction parallel to the direction of the magnetization of the pinned layer (labeled P state) to a direction anti-parallel to the direction of the magnetization of the pinned layer (labeled AP state). The resistance of the AP state is higher than the resistance of the P state, allowing the system to store data as "1" for the high resistance state and "0" for the low resistance state.

Conventional MRAM require a magnetic field to be generated in order to write data (i.e. switch the magnetization of the free layer) and suffer from a lack of scalability due to the current required to generate a high enough magnetic field at small dimensions. It has been demonstrated for some time that passing polarized currents through a magnetic layer can reverse its magnetization, a phenomenon known as spin transfer torque. This effect is the basis of spin torque transfer MRAM (STT-MRAM) and allows high scalability of the storage devices as the current required to write data decreases with the size of the MRAM cell. Typical STT-MRAM require a current density of about $10^6$ A/cm$^2$ to write data and further reduction of this current density is a major topic of research as it would allow the development of low-power consumption devices. However, writing current densities for pure spin-torque effect seem to be approaching a limit.

SUMMARY

According to an embodiment, a magnetoresistive device is provided. The magnetoresistive device may include a fixed magnetic layer structure having a fixed magnetization orientation, a first free magnetic layer structure having a variable magnetization orientation, and a second free magnetic layer structure having variable magnetization orientation, wherein the fixed magnetic layer structure is arranged in between the first tree magnetic layer structure and the second free magnetic layer structure, wherein the magnetization orientation of the first free magnetic layer structure is variable in response to a first electrical signal of a first polarity and the magnetization orientation of the second free magnetic layer structure is at least substantially non-variable in response to the first electrical signal, and wherein the magnetization orientation of the second free magnetic layer structure is variable in response to a second electrical signal of a second polarity and the magnetization orientation of the first free magnetic layer structure is at least substantially non-variable in response to the second electrical signal, wherein the second polarity is opposite to the first polarity.

According to an embodiment, a writing method for a magnetoresistive device is provided. The magnetoresistive device may be as described herein. The method may include applying a first electrical signal of a first polarity for varying a magnetization orientation of the first free magnetic layer structure, wherein a magnetization orientation of the second free magnetic layer structure is at least substantially non-variable in response to the first electrical signal, and applying a second electrical signal of a second polarity for varying a magnetization orientation of the second free magnetic layer structure, wherein the second polarity is opposite to the first polarity, and wherein a magnetization orientation of the first free magnetic layer structure is at least substantially non-variable in response to the second electrical signal.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
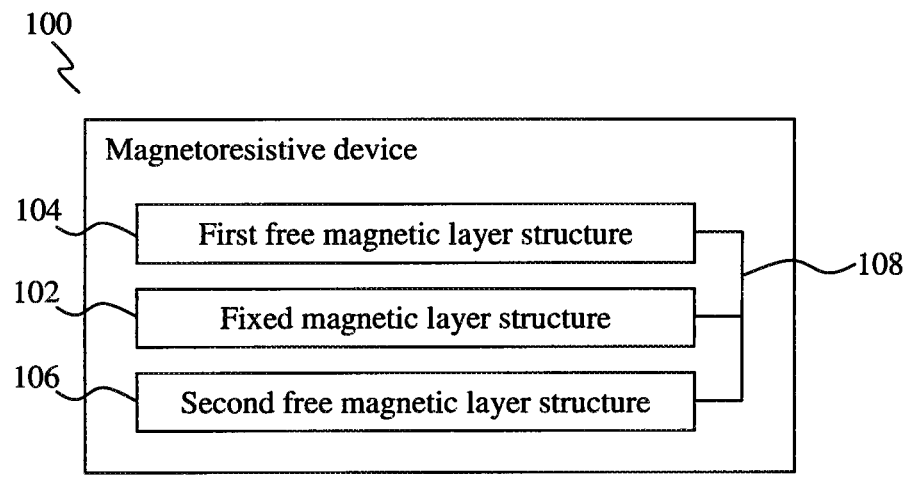
FIG. 1A shows a schematic block diagram of a magnetoresistive device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments relate to a non-volatile magnetic memory device, for example a magnetoresistive random access memory (MRAM) multi-bit per cell device. Various embodiments may provide a multi-bit per cell magnetoresistive random access memory (MRAM) with ultra-low power switching.

Various embodiments may provide a stack stricture design for high density spin torque transfer MRAM (STT-MRAM) with a low writing voltage (power) and long endurance and a writing scheme that uses a combination of spin torque transfer and electric field assisted anisotropy tuning. Various embodiments may be based on the application of electric fields. The electric field, in terms of its magnitude and/or its direction, may affect the magnetic anisotropy of the magnetoresistive device of various embodiments such that switching may be carried out at much smaller current densities.

Various embodiments may provide an electric field assisted spin transfer torque magnetoresistive random access memory (MRAM). Various embodiments may provide a magnetoresistive device that may enable switching magnetization by a spin torque effect in perpendicular anisotropy, and a method for switching magnetization by the spin torque effect, in which the switching is assisted by an electric field applied across the magnetoresistive device. The spin torque effect enables the magnetization orientation, for example of a ferromagnetic soft layer, to be switched by using a spin-polarized current or a spin transfer current. Various embodiments may therefore provide an ultralow-energy magnetic random access memory (MRAM).

As the writing current densities required for pure spin-torque effect MRAM (STT-MRAM) seem to be approaching a limit, writing schemes are believed to be required to address this, e.g. based on the methods of various embodiments.

In order that the invention may be readily understood and put into practical effect, particular embodiments will now be described by way of examples and not limitations, and with reference to the figures.

Figure 1B:
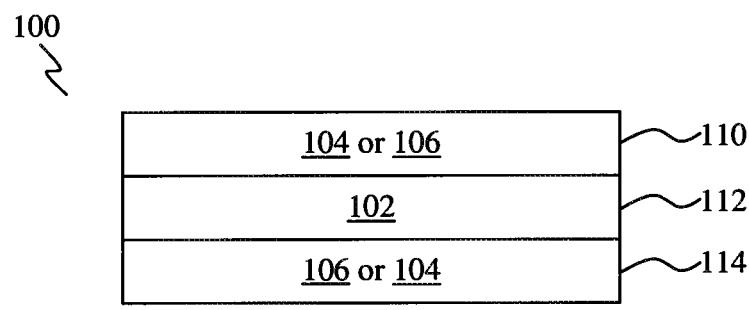
FIG. 1B shows a simplified cross-sectional representation of the magnetoresistive device of the embodiment of FIG. 1A, according to various embodiments.

FIG. 1A shows a schematic block diagram of a magnetoresistive device 100, while FIG. 1B shows a simplified cross-sectional representation of the magnetoresistive device 100 of the embodiment of FIG. 1A, according to various embodiments. The magnetoresistive device 100 includes a fixed magnetic layer structure 102 having a fixed magnetization orientation, a first free magnetic layer structure 104 having a variable magnetization orientation, and a second free magnetic layer structure 106 having a variable magnetization orientation, wherein the fixed magnetic layer structure 102 is arranged in between the first free magnetic layer structure 104 and the second free magnetic layer structure 106, wherein the magnetization orientation of the first free magnetic layer structure 104 is variable in response to a first electrical signal of a first polarity and the magnetization orientation of the second free magnetic layer structure 106 is at least substantially non-variable in response to the first electrical signal, and wherein the magnetization orientation of the second free magnetic layer structure 106 is variable in response to a second electrical signal of a second polarity and the magnetization orientation of the first free magnetic layer structure 104 is at least substantially non-variable in response to the second electrical signal, wherein the second polarity is opposite to the first polarity. In FIG. 1A, the line represented as 108 is illustrated to show the relationship between the fixed magnetic layer structure 102, the first free magnetic layer structure 104 and the second free magnetic layer structure 106, which may include electrical coupling and/or mechanical coupling.

In other words, the magnetoresistive device 100 may have a stack arrangement of the fixed magnetic layer structure 102, the first free magnetic layer structure 104 and the second free magnetic layer structure 106. The magnetization orientation of one of the first free magnetic layer structure 104 or the second free magnetic layer structure 106 may be responsive to an electrical signal of a particular polarity while being at least substantially non-responsive to an electrical signal of an opposite polarity, while the converse holds for the magnetization orientation of the other of the first free magnetic layer structure 104 or a second free magnetic layer structure 106. Therefore, independent switching of the respective magnetization orientations of the first free magnetic layer structure 104 and the second free magnetic layer structure 106 may be possible, depending on the polarity of the electrical signal applied to the magnetoresistive device 100.

In the context of various embodiments, the term "fixed magnetic layer structure" may mean a magnetic layer structure having a fixed magnetization orientation. The fixed magnetic layer structure may include a hard ferromagnetic material. The hard ferromagnetic material may be resistant to magnetization and demagnetization (i.e. not easily magnetized and demagnetized), and may have a high hysteresis loss and a high coercivity. In the context of various embodiments, a fixed magnetic layer structure may be referred to as a "hard layer", a "hard magnetic layer" or a "ferromagnetic hard layer". In the context of various embodiments, the fixed magnetic layer structure may act as a reference layer.

In the context of various embodiments, the term "free magnetic layer structure" may mean a magnetic layer structure having a variable or switchable magnetization orientation. In other words, the magnetization orientation may be varied or switched, for example by applying a current, such as a spin-polarized current. The magnetization orientation of the free magnetic layer structure may be varied, depending on the degree or amount of the magnetization reversal field (or current). The free magnetic layer structure may include a soft ferromagnetic material. The soft ferromagnetic material may be receptive to magnetization and demagnetization (i.e. easily magnetized and demagnetized), and may have a small hysteresis loss and a low coercivity, in comparison to the fixed magnetic layer structure. In the context of various embodiments, a free magnetic layer structure may be referred to as a "soft layer", a "soft magnetic layer" or a "ferromagnetic soft layer". In the context of various embodiments, the free magnetic layer structure may act as a storage layer.

In the context of various embodiments, the magnetization orientation of a free magnetic layer structure may be in one of two directions. The free magnetic layer structure may be in a parallel state (P) or an anti-parallel state (AP) with respect to a fixed magnetic layer structure. In the parallel state, the magnetization orientation of the free magnetic layer structure is parallel to the magnetization orientation of the fixed magnetic layer structure, such that the two magnetization orientations are in the same direction. In the anti-parallel state, the magnetization orientation of the free magnetic layer structure is anti-parallel to the magnetization orientation of the fixed magnetic layer structure, such that the two magnetization orientations are in opposite directions.

In various embodiments, the magnetization orientations or directions of the respective magnetic layers, e.g. the fixed magnetic layer structure 102, the first free magnetic layer structure 104 and the second free magnetic layer structure 106, may be configured to orient in a direction at least substantially parallel to a direction of the arrangement or stack structure of the magnetic layers. In other words, the fixed magnetic layer structure 102, the first free magnetic layer structure 104 and the second free magnetic layer structure 106 may be respectively configured such that their respective magnetic easy axis or magnetization orientation is oriented in a direction substantially parallel to a direction of the arrangement or stack arrangement of the fixed magnetic layer structure 102, the first free magnetic layer structure 104 and the second free magnetic layer structure 106, for example being oriented in a direction substantially parallel to a thickness direction of at least one of the fixed magnetic layer structure 102, the first free magnetic layer structure 104 or the second free magnetic layer structure 106.

In the context of various embodiments, the term "easy axis" as applied to magnetism may mean an energetically favorable direction of spontaneous magnetization as a result of magnetic anisotropy. The magnetization orientation may be either of two opposite directions along the easy axis.

As shown in FIG. 1B, the fixed magnetic layer structure 102 is arranged in between the first free magnetic layer structure 104 and the second free magnetic layer structure 106. The fixed magnetic layer structure 102, the first free magnetic layer structure 104 and the second free magnetic layer structure 106 may be arranged in a stack structure.

In embodiments where the first free magnetic layer structure 104 is arranged as the top layer 110, the intermediate layer 112 is the fixed magnetic layer structure 102 with the bottom layer 114 being the second free magnetic layer structure 106.

In embodiments where the second free magnetic layer structure 106 is arranged as the top layer 110, the intermediate layer 112 is the fixed magnetic layer structure 102 with the bottom layer 114 being the first free magnetic layer structure 104.

In various embodiments, the magnetization orientation of the first free magnetic layer structure 104 may be variable between a first direction in response to the first electrical signal having a first magnitude, and a second direction in response to the first electrical signal having a second magnitude different from the first magnitude. In various embodiments, the first direction may be anti-parallel to the fixed magnetization orientation of the fixed magnetic layer structure 102, the second direction may be parallel to the fixed magnetization orientation of the fixed magnetic layer structure 102, and the second magnitude may be larger than the first magnitude. In other words, the magnetization orientation of the first free magnetic layer structure 104 may be switched to the anti-parallel state, e.g. from the parallel state, when an electrical signal of a relatively smaller amplitude, having a particular polarity (e.g. positive or negative), is applied, and the magnetization orientation of the first free magnetic layer structure 104 may be switched to the parallel state, e.g. from the anti parallel state, when an electrical signal of a relatively larger amplitude, of the same polarity, is applied.

In various embodiments, the magnetization orientation of the second free magnetic layer stricture 106 may be variable between a first direction in response to the second electrical signal having a first magnitude, and a second direction in response to the second electrical signal having a second magnitude different from the first magnitude. In various embodiments, the first direction may be anti-parallel to the fixed magnetization orientation of the fixed magnetic layer structure 102, the second direction may be parallel to the fixed magnetization orientation of the fixed magnetic layer structure 102, and the second magnitude may be larger than the first magnitude. In other words, the magnetization orientation of the second free magnetic layer structure 106 may be switched to the anti-parallel state, from the parallel state, when an electrical signal of a relatively smaller amplitude, having a particular polarity (e.g. negative or positive), is applied, and the magnetization orientation of the second free magnetic layer structure 106 may be switched to the parallel state, from the anti-parallel state, when an electrical signal of a relatively larger amplitude, of the same polarity, is applied.

Therefore, switching of the respective magnetization orientations of the first free magnetic layer structure 104 and the second free magnetic layer structure 106 may be achieved by application of bipolar electrical signals, for example voltage signals or pulses of opposite polarities, for respectively switching the magnetization orientation of the first free magnetic layer structure 104 and the magnetization orientation of the second free magnetic layer structure 106. In this way, different free magnetic layer structures may be switched depending on the polarity of the electrical signal. In various embodiments, the magnetoresistive device 100 may therefore allow voltage-controlled switching.

In various embodiments, reversible switching of the magnetization orientation of a free magnetic layer structure (e.g. 104, 106) may be achieved by applying an electrical signal (e.g. voltage) of the same polarity of different magnitudes. In various embodiments, reversible switching of the magnetization orientation of any one or each of the first free magnetic layer stricture 104 and the second free magnetic layer structure 106 may be achieved at a constant magnetic bias field, $H_{bias}$, e.g. $H_{bias}$ of a constant magnitude and/or constant direction. In various embodiments, the magnetic biasing field may be applied in favour of the parallel state, for example for switching the magnetization orientation of a free magnetic layer structure to a parallel state, relative to the magnetization orientation of the fixed magnetic layer structure 102.

In the context of various embodiments, the electrical signals applied may be voltages. In other words, the first electrical signal may be a first voltage for equivalently a first electric field) of a first polarity (e.g. a positive voltage) and the second electrical signal may be a second voltage (or equivalently a second electric field) of a second polarity (e.g. a negative voltage). As a non-limiting example, when an external bias voltage is applied to the magnetoresistive device 100, electric fields may be generated across the insulating first spacer layer and the insulating second spacer layer. In various embodiments, applying a current to the magnetoresistive device 100 may self-generate a voltage and an electric field inside or across the insulation tunnel barriers (e.g. the first spacer layer and/or the second spacer layer).

In the context of various embodiments, the first magnitude (e.g. a relatively smaller amplitude) of each of or any one of the first electrical signal or the second electrical signal may be between about 0.1 V and about 0.4 V, for example between about 0.1 V and about 0.2 V or between about 0.2 V and about 0.4 V. In the context of various embodiments, the second magnitude (e.g. a relatively larger amplitude) of each of or any one of the first electrical signal or the second electrical signal may be between about 0.4 V and about 0.7 V, for example between about 0.4 V and about 0.5 V or between about 0.5 V and about 0.7 V.

In the context of various embodiments, the switching process for the magnetoresistive device 100 may be achieved with a current density of between about $10^2$ A/cm$^2$ and about $10^5$ A/cm$^2$, for example between about $10^2$ A/cm$^2$ and about $10^3$ A/cm$^2$, or between about $10^3$ A/cm$^2$ and about $10^5$ A/cm$^2$.

In the context of various embodiments, for switching from the parallel state or direction to the anti-parallel state or direction, the switching process may also be assisted by the spin transfer torque effect, based on a spin-polarized current. Spin transfer torque is a mechanism that involves passing a current through the magnetoresistive device, where the current may be polarized from one layer and as a result the free magnetic layer may be affected. The polarized current may transfer angular momentum to the free magnetic layer, resulting in a torque which may switch the magnetization orientation of the free magnetic layer. In various embodiments, a spin polarized current may be produced by passing a current through a thick magnetic layer where the spin of the electrons may become orientated in the direction of the magnetization orientation of that layer.

In the context of various embodiments, the first free magnetic layer structure 104 may be a bottom magnetic layer structure and the second free magnetic layer structure 106 may be a top magnetic layer structure.

In various embodiments, the magnetoresistive device 100 may further include a first spacer layer between the first free magnetic layer structure 104 and the fixed magnetic layer structure 102, and a second spacer layer between the second free magnetic layer structure 106 and the fixed magnetic layer structure 102, wherein the first spacer layer and the second spacer layer may have different thicknesses.

In various embodiments, the fixed magnetic layer structure 102, the first free magnetic layer stricture 104 and the second free magnetic layer structure 106 may be respectively configured such that their respective magnetic easy axis or magnetization orientation is oriented in a direction substantially perpendicular (i.e. perpendicular anisotropy) to a plane defined by an interface, for example between the fixed magnetic layer structure 102 and the first spacer layer or between the second spacer layer and the second free magnetic layer structure 106.

Each of the first spacer layer and the second spacer layer may include a non-conductive and non-magnetic material or an insulator material. Each of the first spacer layer and the second spacer layer may include a material including but not limited to magnesium oxide (MgO), alumina (AlO$_x$), and titanium oxide (TiO$_x$). By arranging conductive and non-magnetic materials or insulators as spacer layers between the fixed magnetic layer structure 102 with the first free magnetic layer structure 104 and the second free magnetic layer structure 106, the magnetoresistive device 100 may be configured as a tunnel magnetoresistive (TMR) device.

In various embodiments, the thickness of the first spacer layer may be between about 0.5 nm and about 2 nm, for example between about 0.5 nm and about 1.5 nm, between about 0.5 nm and about 1 nm, or between about 1 nm and about 2 nm. In various embodiments, the thickness of the second spacer layer may be between about 0.5 nm and about 2 nm, for example between about 0.5 nm and about 1.5 nm, between about 0.5 nm and about 1 nm, or between about 1 nm and about 2 nm.

In various embodiments, the first free magnetic layer structure 104 and the second free magnetic layer structure 106 may have different thicknesses. In various embodiments, any one of or each of the first free magnetic layer structure 104 and the second free magnetic layer structure 106 may have a thickness of between about 0.3 nm and about 2 nm, for example between about 0.3 nm and about 1.5 nm, between about 0.3 nm and about 1 nm, between about 0.3 nm and about 0.8 nm, between about 0.3 nm and about 0.5 nm, between about 0.5 nm and about 2 nm, between about 0.5 nm and about 1 nm, or between about 1 nm and about 2 nm.

Each of the first free magnetic layer structure 104 and the second free magnetic layer structure 106 may be thin or ultrathin, so that an applied elect is field may influence at least substantially the first free magnetic layer structure 104 and the second free magnetic layer structure 106. The electric field may modify the interfacial magnetic anisotropy such that voltage-controlled switching may be achieved. In contrast, the effect of electric field in conventional devices is negligible due to the thick ferromagnetic layers because the electric field only penetrates slightly into the layers due to screening by the free electrons.

In various embodiments, the fixed magnetic layer structure 102 may have a thickness that is larger than any one of or each of the first free magnetic layer structure 104 and the second free magnetic layer structure 106.

In various embodiments, the fixed magnetic layer structure 102 may have a thickness between about 3 nm and about 50 nm, e.g. between about 3 nm and about 20 nm, between about 3 nm and about 10 nm, between about 10 nm and about 50 nm, between about 30 nm and about 50 nm or between about 5 nm and about 20 nm.

In various embodiments, each of the first free magnetic layer structure 104 and the second free magnetic layer structure 106 may include a material including but not limited to cobalt (Co), iron (Fe), nickel (Ni), boron (B), nitrogen (N), or an alloy including at least one of cobalt (Co), iron (Fe) or nickel (Ni).

In various embodiments, the fixed magnetic layer structure 102 may include a bilayer structure including a first layer of a material including but not limited to cobalt (Co), iron (Fe), boron (B), nickel (Ni) and cobalt-iron (CoFe) and a second layer of a material including but not limited to palladium (Pd), platinum (Pt) and nickel (Ni). In various embodiments, the fixed magnetic layer structure 102 may also include an alloy made of materials including but not limited to at least one of iron (Fe), platinum (Pt) or palladium (Pd). As a non-limiting example, the fixed magnetic layer structure 102 may be a single layer including the alloy.

In various embodiments, the fixed magnetic layer structure 102 may include a bilayer or a multilayer of (Co/X) or (Fe/X), where X may be palladium (Pd), platinum (Pt), or an alloy of Pd and Pt. Any combination of different bilayer structures or multilayer structures, e.g. (Co/Pd) and (Fe/Pt), may also be provided. As a non-uniting example, the fixed magnetic layer structure 102 may include $(Co/Pd)_5$, of 5 layers of Co arranged alternately with 5 layers of Pd, (Co/Pd/Co/Pd/Co/Pd/Co/Pd/Co/Pd). In embodiments with a multilayer structure, the number of repeats of bilayer structures may be more than or equal to 2, e.g. 3, 4, 5 or any higher number.

In the context of various embodiments, it should be appreciated that any one of or each of the fixed magnetic layer structure 102, the first free magnetic layer structure 104 and the second free magnetic layer structure 106 may be a single layer or may have a bilayer structure or a multilayer structure of a plurality of the bilayer structures (e.g. a number of repeating bilayer structures). The single layer may mean a layer which, by itself, has the desired properties, while the bilayer structure or the multilayer structure may mean a structure which, as a combination, has the desired properties.

In various embodiments, the magnetoresistive device 100 may further include a second fixed magnetic layer structure having a fixed magnetization orientation, wherein the respective magnetization orientations of the fixed magnetic layer structure 102 and the second fixed magnetic layer structure are oriented anti-parallel to each other. In other words, the magnetization orientation of the fixed magnetic layer structure 102 and the magnetization orientation of the second fixed magnetic layer structure are oriented opposite to each other. The fixed magnetic layer structure 102 and the second fixed magnetic layer structure may be arranged adjacent to each other.

In various embodiments, the second fixed magnetic layer structure may include a bilayer structure including a first layer of a material including but not limited to cobalt (Co), iron (Fe), boron (B), nickel (Ni) and cobalt-iron (CoFe) and a second layer of a material including but not limited to palladium (Pd), platinum (Pt) and nickel (Ni). In various embodiments, the second fixed magnetic layer structure may also include an alloy made of materials including but not limited to at least one of iron (Fe), platinum (Pt) or palladium (Pd). As a non-limiting example, the second fixed magnetic layer structure may be a single layer including the alloy.

In various embodiments, the magnetoresistive device 100 may further include a spacer layer between the fixed magnetic layer structure 102 and the second fixed magnetic layer structure, the spacer layer including a conductive and non-magnetic material, e.g. copper (Cu). The spacer layer may have a thickness between about 0.5 nm and about 20 nm, for example between about 0.5 nm and about 10 nm, between about 0.5 nm and about 5 nm, between about 1 nm and about 20 nm, between about 1 nm and about 10 nm, or between about 5 nm and about 10 nm. In various embodiments, having the spacer layer between the fixed magnetic layer structure 102 and the second fixed magnetic layer structure may assist in orientating the respective magnetization orientations of the fixed magnetic layer structure 102 and the second fixed magnetic layer structure anti-parallel to each other.

In various embodiments, the magnetoresistive device 100 may further include a first tuning layer associated with the first free magnetic layer structure 104, and a second tuning layer associated with the second free magnetic layer structure 106, wherein each of the first tuning layer and the second tuning layer has a magnetization orientation oriented anti-parallel to the magnetization orientation of the fixed magnetic layer structure 102. The first tuning layer may be arranged adjacent and/or on one side of the first free magnetic layer structure 104. The second tuning layer may be arranged adjacent and/or on one side of the second free magnetic layer structure 106. In various embodiments, any one of or each of the first tuning layer and the second tuning layer may include a material including but not limited to cobalt (Co), iron (Fe) or boron (B). Any one of or each of the first tuning layer and the second tuning layer may include a bilayer structure including a first layer of a material including but not limited to cobalt (Co), iron (Fe), boron (B), nickel (Ni) and cobalt-iron (CoFe) and a second layer of a material including but not limited to palladium (Pd), platinum (Pt) and nickel (Ni), e.g. (Co/Pd) and (Fe/Pt). In the context of various embodiments, any one of or each of the first tuning layer and the second tuning layer may have material(s) and/or arrangement(s) as described in the context of the fixed magnetic layer structure 102. In various embodiments, any one of or each of the first tuning layer and the second tuning layer may have a thickness of between about 1 nm and about 20 nm, for example between about 1 nm and about 10 nm, between about 1 nm and about 5 nm, between about 5 nm and about 20 nm, between about 10 nm and about 20 nm, or between about 5 nm and about 10 nm.

The magnetoresistive device 100 may further include a spacer layer, e.g. having a conductive and non-magnetic material, e.g. copper (Cu), between the first free magnetic layer structure 104 and the first tuning layer, and another spacer layer, e.g. having a conductive and non-magnetic material, e.g. copper (Cu), between the second free magnetic layer structure 106 and the second tuning layer. In various embodiments, having the spacer layer between the first free magnetic layer structure 104 and the first tuning layer and the other spacer layer between the second free magnetic layer structure 106 and the second tuning layer may assist in maintaining the respective magnetization orientations of the first tuning layer and the second tuning layer in an at least substantially same or constant direction (e.g. a downward direction).

In various embodiments, the magnetoresistive device 100 may further include a first anti-ferromagnetic (AFM) layer associated with the first free magnetic layer structure 104, and a second anti-ferromagnetic (AFM) layer associated with the second free magnetic layer structure 106.

The first anti-ferromagnetic layer may be arranged adjacent and/or on one side of the first free magnetic layer structure 104. The second anti-ferromagnetic layer may be arranged adjacent and/or on one side of the second free magnetic layer structure 106.

In various embodiments, the first tuning layer and the first anti-ferromagnetic layer may be arranged on the same side of the first free magnetic layer structure 104. In various embodiments, the second tuning layer and the second anti-ferromagnetic layer may be arranged on the same side of the second free magnetic layer structure 106.

In various embodiments, any one or each of the first anti-ferromagnetic layer and the second anti-ferromagnetic layer may include a material including but not limited to X-manganese or X—Y-manganese, wherein each of X and Y includes but not limited to platinum (Pt), palladium (Pd), iridium (Ir), rhodium (Rh), ruthenium (Pu) or iron (Fe).

In various embodiments, the first anti-ferromagnetic layer and the second anti-ferromagnetic layer may have different thicknesses. In various embodiments, any one of or each of the first anti-ferromagnetic layer and the second anti-ferromagnetic layer may have a thickness of between about 1 nm and about 20 nm, for example between about 1 nm and about 10 nm, between about 1 nm and about 5 nm, between about 2 nm and about 20 nm, between about 2 nm and about 10 nm, or between about 5 nm and about 10 nm.

The fixed magnetic layer structure 102, the first free magnetic layer structure 104 and the second free magnetic layer structure 106 may be part of or form part of a magnetic junction of the magnetoresistive device 100. The magnetic junction may be a magnetic tunnel junction (MTJ), for example for a tunnel magnetoresistive (TMR) device, where electric fields may be generated across insulating spacer layers or tunnel barriers when a voltage is applied. Where a spacer layer is conductive, no electric field may be generated across the conductive spacer layer when a voltage is applied.

In various embodiments, the magnetoresistance device 100 may further include a seed layer structure, wherein the fixed magnetic layer structure 102, the first free magnetic layer structure 104 and the second free magnetic layer structure 106 may be disposed over the seed layer structure. The seed layer structure may facilitate the formation or growth of the fixed magnetic layer structure 102 and/or the first free magnetic layer structure 104 and/or the second free magnetic layer structure 106, for example so as to achieve suitable crystallographic and magnetic properties for the fixed magnetic layer structure 102 and/or the first free magnetic layer structure 104 and/or the second free magnetic layer structure 106. The seed layer structure may include one or more layers including a material including but not limited to any one of or a combination of tantalum (Ta), palladium (Pd), platinum (Pt), ruthenium (Ru), chromium (Cr), nickel (Ni), tungsten (W), aluminium (Al), molybdenum (Mo), iron (Fe), titanium (Ti), silver (Ag), or gold (Au).

In various embodiments, the magnetoresistance device 100 may further include a cap layer structure disposed over the fixed magnetic layer structure 102, the first free magnetic layer structure 104 and the second free magnetic layer structure 106. The cap layer structure may include one or more layers including a material including but not limited to any one of or a combination of tantalum (Ta), palladium (Pd), platinum (Pt), ruthenium (Ru), chromium (Cr), nickel (Ni), tungsten (W), aluminium (Al), molybdenum (Mo), titanium (Ti), silver (Ag), gold (Au), carbon (C), nitrogen (N) or hydrogen (H).

In the context of various embodiments, the cap layer structure and the seed layer structure may be configured or used as electrodes (e.g. top and bottom electrodes respectively) or separate metal electrodes may be formed or provided on the cap layer structure and the seed layer structure.

In the context of various embodiments, where a spacer layer includes a conductive and non-magnetic material (e.g. an electrical conductor), the conductive and non-magnetic material may include but not limited to any one of or any combination of copper (Cu), silver (Ag), gold (Au), tantalum (Ta), chromium (Cr), palladium (Pd), platinum (Pt), iridium (Ir), rhodium (Rh) or ruthenium (Ru).

In the context of various embodiments, where a spacer layer is of a conductive and non-magnetic material, the spacer layer may have a thickness of between about 1 nm and about 20 nm, e.g. between about 1 nm and about 10 nm, between about 1 nm and about 5 nm, between about 5 nm and about 20 nm, between about 5 nm and about 10 nm, or between about 1.5 nm and about 5 nm.

In the context of various embodiments, where a spacer layer includes a non-conductive and non-magnetic material (e.g. an insulator), the non-conductive and non-magnetic material may include but not limited to any one of or any combination of magnesium oxide (MgO), alumina (AlOx) or titanium oxide (TiOx).

In the context of various embodiments, where a spacer layer is of a non-conductive and non-magnetic material, the spacer layer may have a thickness ranging from about 0.3 nm to about 2.0 nm, e.g. about 0.3 nm to about 1.5 nm, about 0.3 nm to about 0.8 nm, about 0.8 nm to about 2.0 nm, about 0.8 nm to about 1.5 nm or about 0.6 nm to about 1.2 nm.

In the context of various embodiments, the term "spacer layer" may be interchangeably used with the term "separation layer".

In the context of various embodiments, the resistance state of the magnetoresistive device 100 may change as a result of a change in its resistivity.

In the context of various embodiments, the respective magnetization orientations of the fixed magnetic layer structure 102, the first free magnetic layer structure 104 and the second free magnetic layer structure 106 may be in several possible directions, in order to represent various multilevel states such as "00" "01" "10" and "11".

In the context of various embodiments, the magnetoresistive device 100 may be or may form part of a memory device, e.g. a magnetoresistive random access memory (MRAM), for example an MRAM with perpendicular anisotropy. In the context of various embodiments, the magnetoresistive device 100 may be or may form part of a spin transfer torque magnetoresistive random access memory (STT-MRAM), for example a STT-MRAM with perpendicular anisotropy (p-STT-MRAM).

In the context of various embodiments, the magnetoresistive device 100 may be or may form part of a 2-bit per cell spin transfer torque magnetoresistive random access memory (STT-MRAM). In other words, the magnetoresistive device 100 may provide four resistance states, which may enable data storage of up to two bits of information, thereby providing a multi-bit per cell device allowing multi-state or multi-bit storage.

For example, the magnetoresistance device 100 may achieve four resistance levels or states at remnant state and hence may be used for multi-level or multi-bit storage. The four resistance states may correspond, for example to (1) where the respective magnetization directions of the first free magnetic layer structure 104 and the second free magnetic layer structure 106 are parallel to the magnetization direction of the fixed magnetic layer structure 102 (lowest resistance state), (2) where the respective magnetization directions of the first free magnetic layer structure 104 and the second free magnetic layer structure 106 are anti-parallel to the magnetization direction of the fixed magnetic layer structure 102 (highest resistance state), (3) where the magnetization direction of the first free magnetic layer structure 104 is parallel to, while the magnetization direction of the second free magnetic layer structure 106 is anti-parallel to the magnetization direction of the fixed magnetic layer structure 102, and (4) where the magnetization direction of the first free magnetic layer structure 104 is anti-parallel to, while the magnetization direction of the second free magnetic layer structure 106 is parallel to the magnetization direction of the fixed magnetic layer structure 102.

In the context of various embodiments, the terms "first" and "second" with respect to a feature (e.g. free magnetic layer structure) refer to separate but similar features. The terms may be interchangeable, for example depending on the arrangement of the magnetoresistive device. For example, where two free magnetic layer structures are arranged one above the other, the bottom free magnetic layer structure may be termed as "first free magnetic layer structure" while the top free magnetic layer structure may be termed as "second free magnetic layer structure", or vice versa.

In the context of various embodiments, the term "arranged" may be interchangeably used with the terms "disposed" and/or "formed".

In the context of various embodiments, the term "adjacent" as applied to two layers may include an arrangement where the two layers are in contact with each other or an arrangement where the two layers are separated by an intermediate layer, e.g. a spacer layer.

Figure 1C:
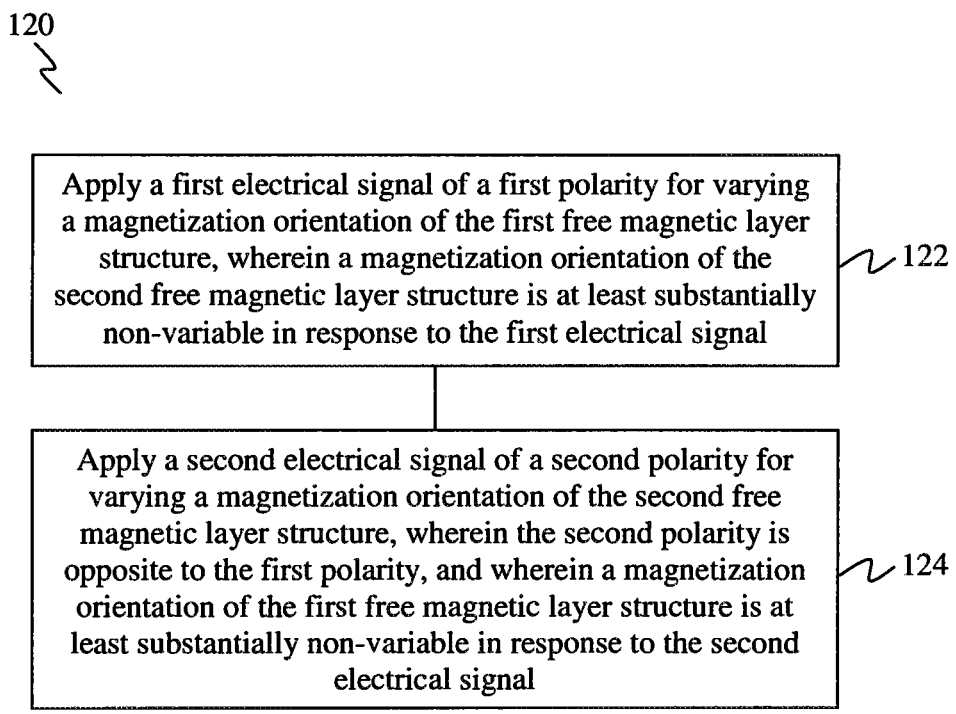
FIG. 1C shows a flow chart illustrating a writing method for a magnetoresistive device, according to various embodiments.

FIG. 1C shows a flow chart 120 illustrating a writing method for a magnetoresistive device, according to various embodiments. The magnetoresistive device may include a fixed magnetic layer structure, a first free magnetic layer structure and a second free magnetic layer structure. In the context of various embodiments, the writing method 120 may be applied to the magnetoresistive device 100 of various embodiments.

At 122, a first electrical signal of a first polarity for varying a magnetization orientation of the first free magnetic layer structure is applied, wherein a magnetization orientation of the second free magnetic layer structure is at least substantially non-variable in response to the first electrical signal.

At 124, a second electrical signal of a second polarity for varying a magnetization orientation of the second free magnetic layer structure is applied, wherein the second polarity is opposite to the first polarity, and wherein a magnetization orientation of the first free magnetic layer structure is at least substantially non-variable in response to the second electrical signal.

In various embodiments, at 122, a magnitude of the first electrical signal is changed or varied.

In various embodiments, at 124, a magnitude of the second electrical signal is changed or varied.

Figure 2:
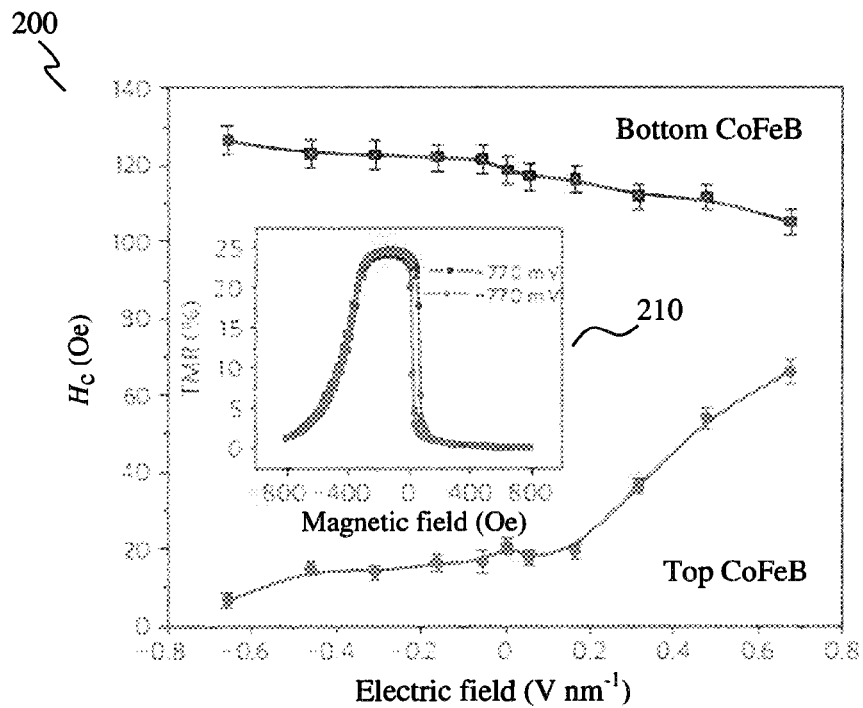
FIG. 2 shows a plot illustrating the effect of an applied electric field across a magnetic tunnel junction (MTJ) on the coercivity of thin cobalt-iron-boron (CoFeB) magnetic layers.

FIG. 2 shows a plot 200 illustrating the effect of an applied electric field across a magnetic tunnel junction (MTJ) on the coercivity of thin cobalt-iron-boron (CoFeB) magnetic layers (W-G, Wang, et al. "Electric-field-assisted switching in magnetic tunnel junctions", Nature Materials Vol 11, Pages 64-68 (2012)). The results show that an applied electric field across a magnetic tunnel junction (MTJ) with perpendicular magnetic anisotropy can either decrease or increase the coercivity of thin cobalt-iron-boron (CoFeB) magnetic layers in a MTJ, depending on the polarity of the electric field. For comparison purposes, results for an MTJ with in-plane magnetic anisotropy under opposite bias voltages are shown in the inset 210.

The coercivity behavior of the CoFeB layer may be determined by the accumulation/depletion of electrons at the MgO/CoFeB interface of the MTJ, depending on the sign of the applied electric field. Where electrons accumulate at the interface, the perpendicular anisotropy of the CoFeB may decrease (e.g. the coercivity of the CoFeB layer may decrease), and may even disappear at a high enough electric field. If electrons are depleted from the MgO/CoFeB interface, the perpendicular anisotropy of the CoFeB layer strengthens (e.g. the coercivity of the CoFeB layer may increase), making it stable and harder to switch. As a non-limiting example, a negative voltage pulse may be applied. The applied negative voltage pulse may be equivalent to an electric field applied such that the top CoFeB may be negatively charged and the bottom CoFeB layer may be positively charged. These correspond to the electrons flowing from the top CoFeB layer, where there is electron accumulation at the interface of the top CoFeB layer with, for example an MgO layer, to the bottom CoFeB layer, where there is electron depletion at the interface of the bottom CoFeB layer with, for example an MgO layer.

Therefore, for a MTJ structure where a MgO tunnel barrier is sandwiched between two CoFeB layers, a constant applied electric field may result in electron accumulation at one MgO/CoFeB interface, and electron depletion at the other MgO/CoFeB interface. This implies that one of the CoFeB layers may be switched more easily than the other, and this allows reversible switching with layer selectivity.

In various embodiments, switching of the free layers (e.g. free CoFeB layers) may be achieved by applying a magnetic bias field to the device. Where $H_c^V$ represents the coercivity of the free layer (e.g. CoFeB layer) at an applied voltage V, and $H_c^0$ represents the coercivity of the free layer (e.g. CoFeB layer) at substantially zero voltage, and assuming that the free layer (e.g. CoFeB layer) has a symmetric, bias-free magnetization-applied field (M-H) hysteresis loop, the bias field $H_{bias}$ may be chosen such that $H_c^V < |H_{bias}| < H_c^0$. The choice of the bias field value may be explained as illustrated in FIG. 3.

Figure 3:
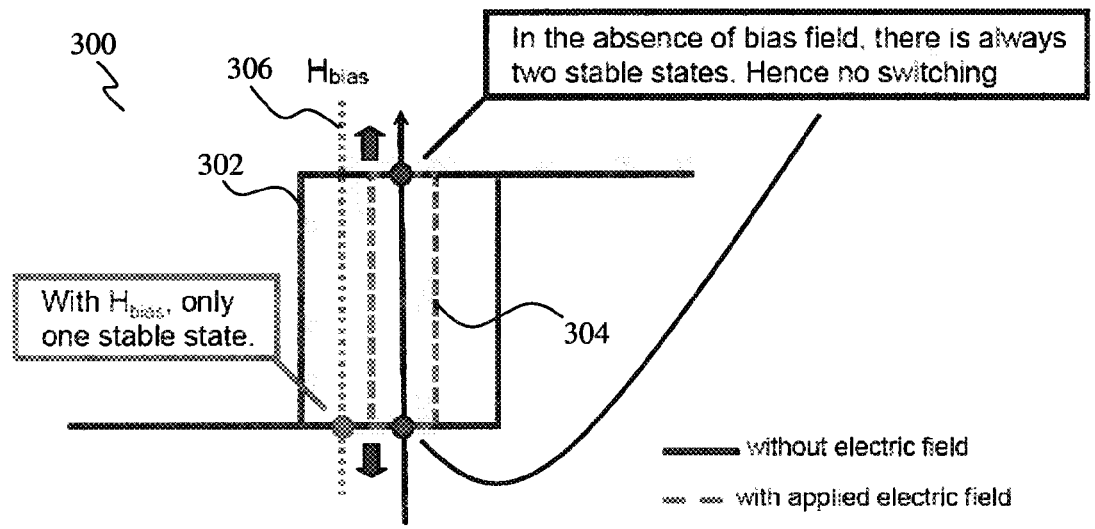
FIG. 3 shows a schematic diagram illustrating how the value of the bias field is chosen to exhibit switching of thin magnetic layers when an electric field is applied.

FIG. 3 shows a schematic diagram 300 illustrating how the value of the bias field is chosen to exhibit switching of thin magnetic layers when an electric field is applied. Assuming that the magnetization orientation of a free layer (e.g. CoFeB layer) is initially in the upward direction, when the voltage, V=0 (e.g. no electric field, where $H_c^0$ is represented by the M-H hysteresis loop 302), the coercivity of the CoFeB layer may be large enough such that the upward direction of the magnetization orientation is an at least substantially stable state, and spontaneous switching of the CoFeB layer may not occur. In other words, as shown in FIG. 3, in the absence of a bias field (e.g. electric field and/or magnetic field), no switching occurs as there are two stable states (e.g. the upward direction and the downward direction of the magnetization orientation of the CoFeB layer, as represented by the block arrows). When a voltage, V, is applied, $H_c^V$, as represented by the M-H hysteresis loop 304, decreases such that the only stable equilibrium state at $H_{bias}$, as represented by the dotted line 306, is the downward direction, and switching of the CoFeB layer may therefore occur. Therefore, switching of the magnetization orientation of the CoFeB layer may be carried out where the magnetic bias field, $H_{bias}$, is selected such that $H_c^V < |H_{bias}| < H_c^0$.

Figure 4A:
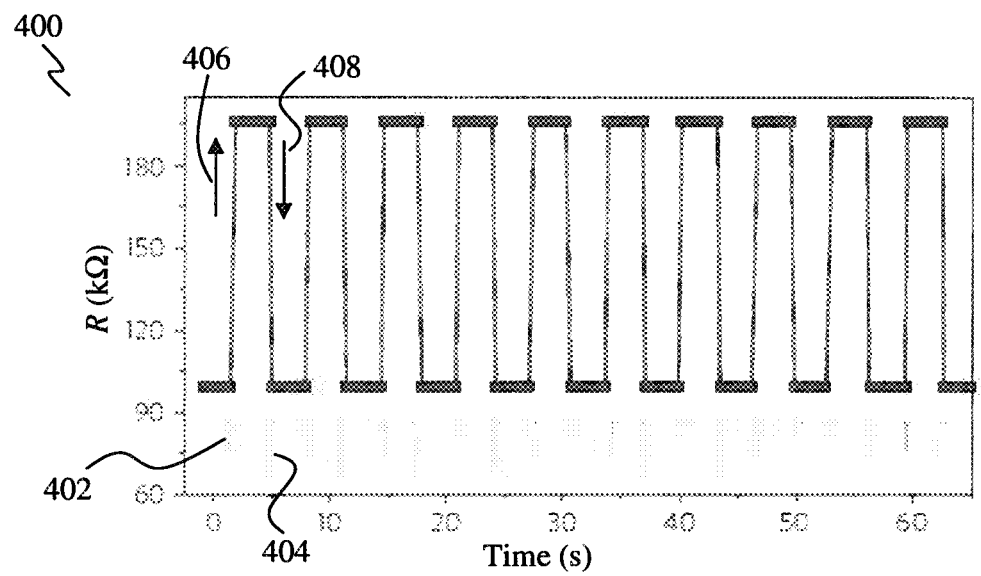
FIGS. 4A and 4B illustrate a unipolar switching scheme.
Figure 4B:
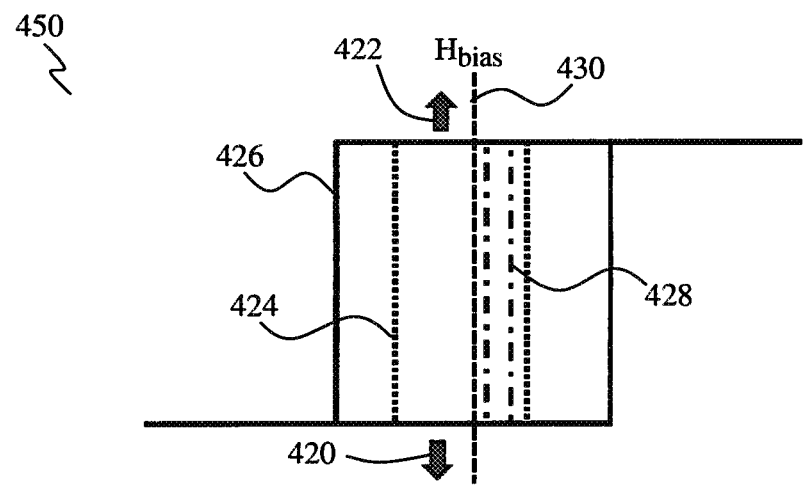

For device applications, a reversible switching scheme called the unipolar switching scheme, as shown in FIGS. 4A and 4B, may be possible (W-G, Wang, et al. "Electric-field-assisted switching in magnetic tunnel junctions", Nature Materials Vol 11, Pages 64-68 (2012)). As illustrated in the timing diagram 400, the scheme uses two negative voltage pulses, 402, 404, of different magnitudes to switch a MTJ (e.g. having a top CoFeB layer and a bottom CoFeB layer) between the parallel (P) and anti-parallel (AP) resistance states. As a non-limiting example, the sign of the applied voltage may be defined so that a negative voltage pulse may stabilize the bottom CoFeB layer, and result in the top CoFeB layer being easier to switch. This corresponds to the electrons flowing from the top CoFeB layer to the bottom CoFeB layer.

Where the magnetization orientation of the bottom CoFeB layer is initially in the downward direction (as represented by the block arrow 420), for parallel to anti-parallel (P→AP) switching, as represented by the arrow 406, from a low resistance state to a high resistance state, switching of the top CoFeB layer may be achieved by lowering the coercivity of the top CoFeB layer, as well as assisted spin torque transfer (STT) switching from the scattered minority electrons from the bottom CoFeB layer, where such P→AP switching 406 occurs at a negative pulse 402 with a smaller magnitude. As a result, the magnetization orientation of the top CoFeB layer may be in an upward direction (as represented by the block arrow 422). As shown in the schematic diagram 450 of FIG. 4B, when a negative voltage pulse with a small magnitude is applied, the coercivity of the top CoFeB layer is decreased, as represented by the M-H hysteresis loop 424, as compared to the M-H hysteresis loop 426 when no voltage pulse is applied.

For anti-parallel to parallel (AP→P) switching, as represented by the arrow 408, from a high resistance state to a low resistance state, of the top CoFeB layer, a negative voltage pulse 404 of a larger magnitude may be used to decrease the coercivity of the top CoFeB layer even further, as represented by the M-H hysteresis loop 428, so that only the downward state 420 of the magnetization orientation of the top CoFeB layer is available at the applied bias field, $H_{bias}$, as represented by the dotted line 430. It should be appreciated that the bias field, $H_{bias}$, may be at least substantially constantly applied, as $H_{bias}$ may be self-generated by the system or the magnetoresistive device.

Figure 5:
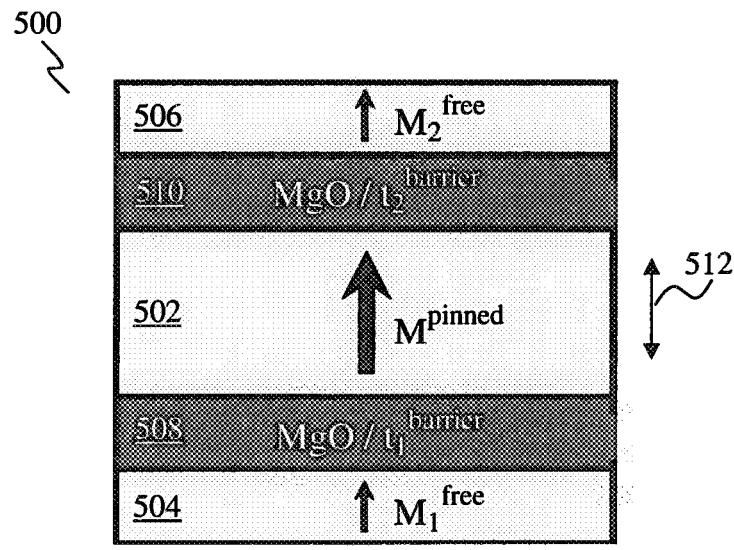
FIG. 5 shows a schematic cross-sectional view of a magnetoresistive device, according to various embodiments.

FIG. 5 shows a schematic cross-sectional view of a magnetoresistive device 500, according to various embodiments. The magnetoresistive device 500 may be a 2-bit per cell magnetic random access memory (MRAM) employing an electric field with spin torque transfer assistance for individual writing of each free layer, which have advantages over the conventional unipolar switching 1-bit per cell MRAM. For example, the magnetoresistive device 500 includes features that may allow it to operate at a suitable bias field (e.g. magnetic bias field), as well as giving four distinct resistance states corresponding to the four possible magnetization orientations in the 2-bit MRAM 500.

The magnetoresistive device 500 may be a tunneling magnetoresistive (TMR) device, e.g. a spin transfer torque magnetic random access memory (STT-MRAM) with perpendicular anisotropy. The magnetoresistive device 500 has a stack structure, having for example a plurality of magnetic or ferromagnetic layers.

The magnetoresistive device 500 includes a fixed magnetic layer structure (a ferromagnetic hard layer) 502 as a reference layer or a pinned layer ($M^{pinned}$), and two (2) free magnetic layer structures (ferromagnetic soft layers), e.g. a first free magnetic layer structure ($M_1^{free}$) 504 and a second free magnetic layer structure ($M_2^{free}$) 506, arranged one over the other. As illustrated in FIG. 5, the fixed magnetic layer structure 502 may be arranged or sandwiched in between the first free magnetic layer structure 504 and the second free magnetic layer structure 506. The fixed magnetic layer structure 502 may have a fixed magnetization orientation and each of the first free magnetic layer structure 504 and the second free magnetic layer structure 506 may have a variable or free magnetization orientation, i.e. the magnetization orientation is changeable or switchable between different orientations or states, e.g. in response to a current and/or a voltage applied across the magnetoresistive device 500.

The fixed magnetic layer structure 502, the first free magnetic layer structure 504 and the second free magnetic layer structure 506 may form part of a magnetic junction of the magnetoresistive device 500.

The fixed magnetic layer structure 502, the first free magnetic layer structure 504 and the second free magnetic layer structure 506 may be respectively configured such that their respective magnetic easy axis or magnetization orientation is oriented in a direction substantially parallel to a direction, as represented by the arrow 512, of the arrangement or stack arrangement of the fixed magnetic layer structure 102, the first free magnetic layer structure 104 and the second free magnetic layer structure 106, for example being oriented in a direction substantially parallel to a thickness direction, as represented by 512, of at least one of the fixed magnetic layer structure 502, the first free magnetic layer structure 504 or the second free magnetic layer structure 506.

As shown in FIG. 5, the arrow shown within the fixed magnetic layer structure 502 illustrates the direction of magnetization orientation of the fixed magnetic layer structure 502. While the arrow is shown pointing in an upward direction to represent the magnetization orientation of the fixed magnetic layer structure 502 being oriented in an upwardly direction, it should be appreciated that the arrow may be illustrated as pointing in a downward direction, such that a magnetization orientation in the opposite direction to that of the embodiment of FIG. 5 may be provided for the fixed magnetic layer structure 502.

The magnetization orientation or direction of each of the first free magnetic layer structure 504 and the second free magnetic layer structure 506 may be oriented parallel to and in the same direction (parallel, P, state) as the magnetization orientation of the fixed magnetic layer structure 502, or oriented parallel to and in the opposite direction (anti-parallel, AP, state) as the magnetization orientation of the fixed magnetic layer structure 502. The respective arrows shown within the first free magnetic layer structure 504 and the second free magnetic layer structure 506 illustrate the upwardly direction of the magnetization orientation, such that the magnetization orientation of each of the first free magnetic layer structure 504 and the second free magnetic layer structure 506 may be in a parallel direction or state with respect to the magnetization orientation of the fixed magnetic layer structure 502. This may for example be the initial state of the magnetoresistive device 500.

In various embodiments, the first free magnetic layer structure 504 and the second free magnetic layer structure 506 may be designed such that they possess the desired coercivity-electric field behavior in the structure of the magnetoresistive device 500, and independent writing of the free layers may be achieved.

In various embodiments, the fixed magnetic layer structure 502 may be a thick pinned layer, which may be unaffected by magneto-electric effect. The fixed magnetic layer structure (reference layer) 502 may be thick enough such that an applied electric field may not change its coercivity significantly, and the fixed magnetic layer structure (reference layer) 502 has enough perpendicular anisotropy such that it may at least substantially maintain a constant magnetization direction. In various embodiments, the fixed magnetic layer structure 502 may include or may be a bilayer structure or a multilayer structure having an arrangement of, for example, cobalt/palladium (Co/Pd), iron/platinum (Fe/Pt), etc. In various embodiments, the fixed magnetic layer structure 502 may provide spin polarization for spin transfer torque (STT) assistance.

In various embodiments, each of the first free magnetic layer structure 504 and the second free magnetic layer structure 506 may be a thin or ultrathin layer. In various embodiments, each of the first free magnetic layer structure 504 and the second free magnetic layer structure 506 may have the same thickness or different thicknesses, depending on the design of the coercivity, $H_c$, of each of the first free magnetic layer structure 504 and the second free magnetic layer structure 506 for switching. Each of the first free magnetic layer structure 504 and the second free magnetic layer structure 506 may include a material such as cobalt-iron-boron (CoFeB), iron-boron (FeB), etc.

As shown in FIG. 5, each of the fixed magnetic layer structure 502, the first free magnetic layer structure 504 and the second free magnetic layer structure 506 may be separated from each other by a separating layer, for example a spacer layer.

The magnetoresistive device 500 includes a spacer layer 508 arranged in between the fixed magnetic layer structure 502 and the first free magnetic layer structure 504. The magnetoresistive device 500 further includes a spacer layer 510 arranged in between the fixed magnetic layer structure 502 and the second free magnetic layer structure 506.

Each of the spacer layers 508, 510 may be of a non-conductive and non-magnetic material (e.g. an insulator). For example, each of the spacer layers 508, 510 may include magnesium oxide (MgO). However, it should be appreciated that other materials such as aluminium oxide ($AlO_x$), or titanium oxide ($TiO_x$) may also be used. The magnetoresistive device 500 may therefore be configured as a tunneling magnetoresistive (TMR) device.

The spacer layers 508, 510 may have different thicknesses, which may allow easy data reading from the magnetoresistive device 500. In addition, the spacer layers 508, 510, for example tunnel barriers, may be of different thicknesses so that there may be four different resistance states corresponding to the four possible magnetization orientations in the two free magnetic layers (the first free magnetic layer structure 504 and the second free magnetic layer structure 506).

The thickness, $t_1^{barrier}$, of the spacer layer 508 may be between about 0.5 nm and about 2 nm. The thickness, $t_2^{barrier}$, of the spacer layer 510 may be between about 0.5 nm and about 2 nm.

As illustrated in FIG. 5, the fixed magnetic layer structure 502, the first free magnetic layer structure 504 and the second free magnetic layer structure 506 have their magnetic easy axis (e.g. magnetization orientation or direction) aligned in a direction at least substantially perpendicular (i.e. perpendicular anisotropy) to a plane defined by an interface, for example an interface between the fixed magnetic layer structure 502 and any one of the spacer layer 508 or the spacer layer 510.

Accordingly, the magnetoresistive device 500 may have a stack arrangement having different ferromagnetic layers in the order, starting from the bottom layer, of the first free magnetic layer structure 504, which may be a thin magnetic layer, the spacer layer (e.g. a tunnel barrier) 508, the fixed magnetic layer structure (e.g. reference layer) 502, the spacer layer (e.g. a tunnel barrier) 510 and the second free magnetic layer structure 506, which may be a thin magnetic layer.

Therefore, in one embodiment, the magnetoresistive device 500 may include two thin magnetic free layers (e.g. 504, 506), such as CoFeB layers, two tunnel barriers of different thicknesses (e.g. 508, 510), such as MgO spacer layers, and one magnetic, thick, and pinned reference layer (e.g. 502) such as Co/Pd or Fe/Pt multilayers.

Figure 6:
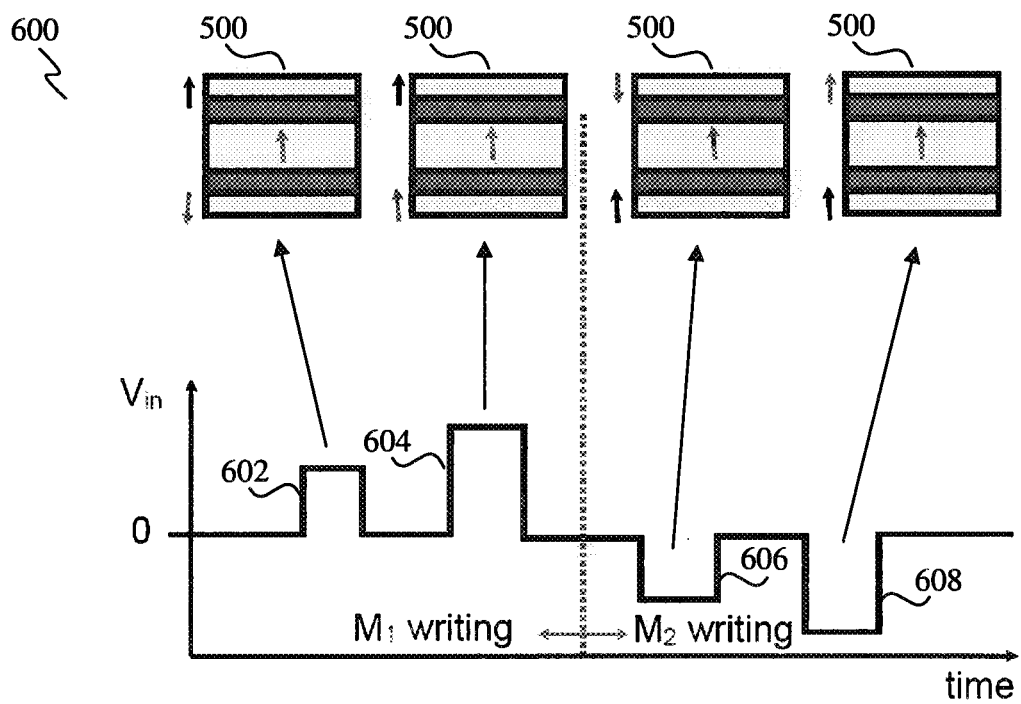
FIG. 6 shows a schematic diagram illustrating a writing method for a magnetoresistive device, according to various embodiments.

FIG. 6 shows a schematic diagram 600 illustrating a writing method for a magnetoresistive device (e.g. the magnetoresistive device 500 of the embodiment of FIG. 5), according to various embodiments. The writing method may be employed, for example, for a 2-bit per cell MRAM or a multi-bit per cell MRAM.

As a non-limiting example, the writing method of the embodiment of FIG. 6 is explained based on the magnetoresistive device 500, having a fixed magnetic layer structure 502 as a reference layer, a first free magnetic layer structure 504, a second free magnetic layer structure 506, and two spacer layers 508, 510.

As a non-limiting example, the fixed magnetic layer structure 502 may have a constant or fixed magnetization orientation in an upwardly direction, as illustrated in FIG. 6. In addition, in the initial state, the respective magnetization orientation of the first free magnetic layer structure 504 and the second free magnetic layer structure 506 may be oriented in an upward direction, in a parallel state relative to the magnetization orientation of the fixed magnetic layer structure 502. The respective arrows corresponding to the fixed magnetic layer structure 502, the first free magnetic layer structure 504 and the second free magnetic layer structure 506 illustrate the respective magnetization orientations.

When a positive voltage pulse is applied, where $V_{in}>0$, in which electrons flow from the first free magnetic layer structure (bottom free layer) 504 to the second free magnetic layer structure (top free layer) 506, the second free magnetic layer structure 506 may be stabilized while the first free magnetic layer structure 504 may be easier to switch, in other words the magnetization orientation of the first free magnetic layer structure 504 may become relatively easily switchable or variable.

For P→AP switching, when a positive voltage pulse 602 of a smaller magnitude is applied, the coercivity of the first free magnetic layer structure 504 may be reduced. The switching may be completed by the spin torque transfer of the minority electrons scattered off the fixed magnetic layer structure 502, similar to the unipolar scheme. As a result, the magnetization orientation of the first free magnetic layer structure 504 may be switched to the downward direction, as shown in FIG. 6.

For AP→P switching, when a positive voltage pulse 604 of a larger magnitude (as compared to the voltage pulse 602 at least) is applied, the coercivity of the first free magnetic layer structure 504 may be reduced substantially such that the only stable magnetization state at $H_{bias}$ is the upward direction. As a result, the magnetization orientation of the first free magnetic layer structure 504 may be switched to the upward direction, as shown in FIG. 6.

When a negative voltage pulse is applied, where $V_{in}<0$, in which electrons flow from the the second free magnetic layer structure (top free layer) 506 to the first free magnetic layer structure (bottom free layer) 504, the first free magnetic layer structure 504 may be stabilized while the second free magnetic layer structure 506 may be easier to switch, in other words the magnetization orientation of the second free magnetic layer structure 506 may become relatively easily switchable or variable.

The switching mechanism may be similar as aforementioned in the case when $V_{in}>0$, but with negative voltage pulses being applied instead. This means that for P→AP switching, when a negative voltage pulse 606 of a smaller magnitude is applied, the coercivity of the second free magnetic layer structure 506 may be reduced. The switching may be completed by the spin torque transfer of the minority electrons scattered off the fixed magnetic layer structure 502. As a result, the magnetization orientation of the second free magnetic layer structure 506 may be switched to the downward direction, as shown in FIG. 6. In addition, for AP→P switching, when a negative voltage pulse 608 of a larger magnitude (as compared to the voltage pulse 606 at least) is applied, the coercivity of the second free magnetic layer structure 506 may be reduced substantially such that the only stable magnetization state at $H_{bias}$ is the upward direction. As a result, the magnetization orientation of the second free magnetic layer structure 506 may be switched to the upward direction, as shown in FIG. 6.

Therefore, the magnetoresistive device of various embodiments (e.g. the magnetoresistive device 500) may exhibit switching with individual free layer or free magnetic layer structure selectivity, e.g. each free magnetic layer structure may be chosen to be written independently without at least substantially affecting the other of the free magnetic layer structures.

In various embodiments, a requirement for the structure of the magnetoresistive device of various embodiments is that the magnetoresistive device needs to operate at a suitable bias field. As the magnetoresistive devices scale down to, for example, below 100 nm, the stray field from the reference layer (e.g. fixed magnetic layer structure 502) may become so large such that no magnetic switching may occur in both free layers (e.g. first free magnetic layer structure 504 and second free magnetic layer structure 506). Such a challenge may be addressed for example by the magnetoresistive device of the embodiment of FIG. 7.

Figure 7:
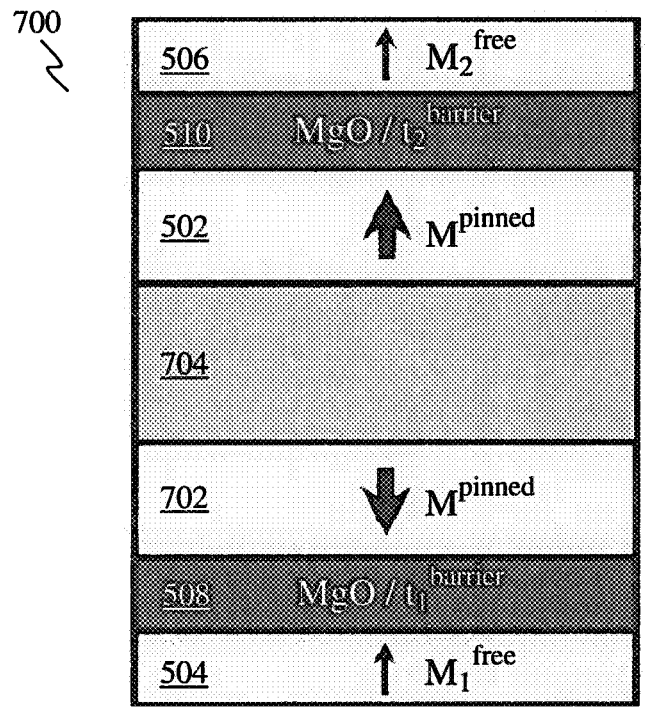
FIG. 7 shows a schematic cross-sectional view of a magnetoresistive device, according to various embodiments.

FIG. 7 shows a schematic cross-sectional view of a magnetoresistive device 700, according to various embodiments. The magnetoresistive device 700 may be a 2-bit per cell magnetic random access memory (MRAM) employing an electric field with spin torque transfer assistance for individual writing of each free layer. The magnetoresistive device 700 may include bias field tuning capability.

The magnetoresistive device 700 may be a tunneling magnetoresistive (TMR) device, e.g. a spin transfer torque magnetic random access memory (STT-MRAM) with perpendicular anisotropy. The magnetoresistive device 700 has a stack structure, having for example a plurality of magnetic or ferromagnetic layers.

The magnetoresistive device 700 may include a fixed magnetic layer structure (a ferromagnetic hard layer) 502, two (2) free magnetic layer structures (ferromagnetic soft layers), e.g. a first free magnetic layer structure 504 and a second free magnetic layer structure 506, arranged one over the other, and spacer layers 508, 510, which may be as described in the context of the embodiment of FIG. 5.

The magnetoresistive device 700 may further include a second fixed magnetic layer structure (a ferromagnetic hard layer) 702. The fixed magnetic layer structure 502 and the second fixed magnetic layer structure 702 may be aligned anti-parallel to each other. In other words, the magnetization orientation of the second fixed magnetic layer structure 702 may be aligned or oriented anti-parallel to the magnetization orientation of the fixed magnetic layer structure 502. In this way, the pinned layers, being the fixed magnetic layer structure 502 and the second fixed magnetic layer structure 702, with opposite magnetization orientations or directions may reduce the stray field experienced by the free layers, being the first free magnetic layer structure 504 and the second free magnetic layer structure 506. For example, the respective stray fields from the fixed magnetic layer structure 502 and the second fixed magnetic layer structure 702 may be compensated or offset by each other.

In various embodiments, the second fixed magnetic layer structure 702 may be a thick pinned layer, which may be unaffected by magneto-electric effect. The second fixed magnetic layer structure 702 may be thick enough such that the applied electric field may not change its coercivity significantly, and the second fixed magnetic layer structure 702 has enough perpendicular anisotropy such that it may at least substantially maintain a constant magnetization direction.

In various embodiments, the second fixed magnetic layer structure may be arranged spaced from the fixed magnetic layer structure 502 by a spacer layer 704 which may include or may be of a non-magnetic material, e.g. a conductive and non-magnetic material such as copper (Cu). However, it should be appreciated that other conductive and non-magnetic materials including but not limited to silver (Ag), gold (Au), tantalum (Ta), chromium (Cr), palladium (Pd), platinum (Pt), iridium (Ir), rhodium (Rh) or ruthenium (Ru) may also be used or a non-conductive and non-magnetic material (e.g. an insulator) including but not limited to magnesium oxide (MgO), aluminium oxide ($AlO_x$) or titanium oxide ($TiO_x$) may be used.

In various embodiments, the spacer layer 704 may be a thick non-magnetic layer to decouple the two reference layers (the fixed magnetic layer structure 502 and the second fixed magnetic layer structure 702), and tune the bias field strength experienced by the free layers (the first free magnetic layer structure 504 and the second free magnetic layer structure 506). The thickness of the spacer layer 704 may be between about 1 nm and about 20 nm.

In various embodiments, the bias field (e.g. magnetic bias field) of each of the the first free magnetic layer structure 504 and the second free magnetic layer structure 506 (free layers) may be tuned by either changing the saturation magnetization of the additional magnetic layer (e.g. the second fixed magnetic layer structure 702), or changing the thickness of the spacer layer 704, or both.

In the context of various embodiments, the term "saturation magnetization" may mean the maximum induced magnetic moment that may be obtained for a material in a magnetic field, which beyond this field no further increase in magnetization occurs.

Accordingly, the magnetoresistive device 700 may have a stack arrangement having different ferromagnetic layers in the order, starting from the bottom layer, of the first free magnetic layer structure 504, which may be a thin magnetic layer, the spacer layer (e.g. a tunnel barrier) 508, the second fixed magnetic layer structure (e.g. reference layer) 702, the spacer layer 704, the fixed magnetic layer structure (e.g. reference layer or reference barrier) 502, the spacer layer (e.g. a tunnel barrier) 510 and the second free magnetic layer structure 506, which may be a thin magnetic layer.

Therefore, in one embodiment, the magnetoresistive device 700 may include two thin magnetic free layers (e.g. 504, 506), such as CoFeB layers, two tunnel barriers of different thicknesses (e.g. 508, 510), such as MgO spacer layers, two magnetic, thick, and pinned reference layer (e.g. 502, 702) such as Co/Pd or Fe/Pt multilayers, and a non-magnetic, conductive spacer layer (e.g. 704) such as a copper (Cu) spacer layer.

Figure 8:
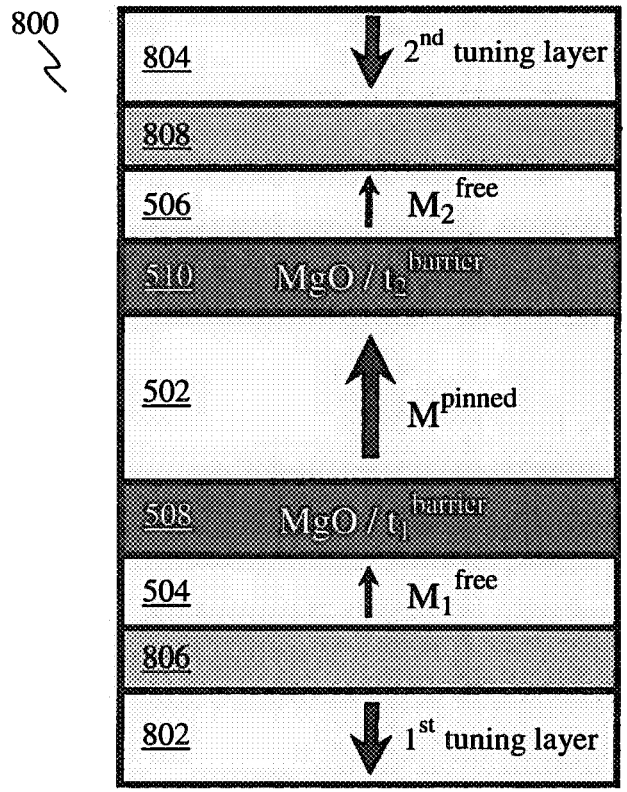
FIG. 8 shows a schematic cross-sectional view of a magnetoresistive device, according to various embodiments.

FIG. 8 shows a schematic cross-sectional view of a magnetoresistive device 800, according to various embodiments. The magnetoresistive device 800 may be a 2-bit per cell magnetic random access memory (MRAM) employing an electric field with spin torque transfer assistance for individual writing of each free layer. The magnetoresistive device 800 may include bias field tuning capability.

The magnetoresistive device 800 may be a tunneling magnetoresistive (TMR) device, e.g. a spin transfer torque magnetic random access memory (STT-MRAM) with perpendicular anisotropy. The magnetoresistive device 800 has a stack structure, having for example a plurality of magnetic or ferromagnetic layers.

The magnetoresistive device 800 may include a fixed magnetic layer structure (a ferromagnetic hard layer) 502, two (2) free magnetic layer structures (ferromagnetic soft layers), e.g. a first free magnetic layer structure 504 and a second free magnetic layer structure 506, arranged one over the other, and spacer layers 508, 510, which may be as described in the context of the embodiment of FIG. 5.

The magnetoresistive device 800 may further include a respective magnetic layer, for example a tuning layer, arranged on one side of each of the first free magnetic layer structure 504 and the second free magnetic layer structure 506. For example, the magnetoresistive device 800 may further include a first tuning layer 802 arranged on one side of the first free magnetic layer structure 504, for example on the side of the first free magnetic layer structure 504 opposite to the fixed magnetic layer structure 502, and a second tuning layer 804 arranged on one side of the second free magnetic layer structure 506, for example on the side of the second free magnetic layer structure 506 opposite to the fixed magnetic layer structure 502. In various embodiments, any one of or each of the first tuning layer 802 and the second tuning layer 804 may include a material including but not limited to cobalt (Co), iron (Fe) or boron (B). Any one of or each of the first tuning layer 802 and the second tuning layer 804 may include a bilayer structure including a first layer of a material including but not limited to cobalt (Co), iron (Fe), boron (B), nickel (Ni) and cobalt-iron (CoFe) and a second layer of a material including but not limited to palladium (Pd), platinum (Pt) and nickel (Ni), e.g. (Co/Pd) and (Fe/Pt). In various embodiments, any one of or each of the first tuning layer 802 and the second tuning layer 804 may have a thickness of between about 1 nm and about 20 nm.

In various embodiments, the first tuning layer 802 may be arranged spaced from the first free magnetic layer structure 504 by a spacer layer 806 which may include or may be of a non-magnetic conductor, e.g. a conductive and non-magnetic material such as copper (Cu). However, it should be appreciated that other conductive and non-magnetic materials including but not limited to silver (Ag), gold (Au), tantalum (Ta), chromium (Cr), palladium (Pd), platinum (Pt), iridium (Ir), rhodium (Rh) or ruthenium (Ru) may also be used or a non-conductive and non-magnetic material (e.g. an insulator) including but not limited to magnesium oxide (MgO), aluminium oxide (AlOx) or titanium oxide (TiOx) may be used.

In addition, the second tuning layer 804 may be arranged spaced from the second free magnetic layer structure 506 by a spacer layer 808 which may include or may be of a non-magnetic conductor, e.g. a conductive and non-magnetic material such as copper (Cu). However, it should be appreciated that other conductive and non-magnetic materials including but not limited to silver (Ag), gold (Au), tantalum (Ta), chromium (Cr), palladium (Pd), platinum (Pt), iridium (Ir), rhodium (Rh) or ruthenium (Ru) may also be used or a non-conductive and non-magnetic material (e.g. an insulator) including but not limited to magnesium oxide (MgO), aluminium oxide (AlOx) or titanium oxide (TiOx) may be used.

Therefore, the magnetoresistive device 800 may have a structure that is at least substantially similar to that of the magnetoresistive device 500 of FIG. 5, and further including one magnetic layer predisposed on the other side of each free layer, which is spaced by a non-magnetic conductor.

In various embodiments, the first tuning layer 802 and the second tuning layer 804 may be prepared or arranged in a way that may ensure that their respective magnetization orientations point in a direction opposite to the direction of the magnetization orientation of the fixed magnetic layer structure (pinned layer) 502. In other words, the respective magnetization orientations of the first tuning layer 802 and the second tuning layer 804 may be aligned or oriented anti-parallel to the magnetization orientation of the fixed magnetic layer structure 502. In this way, the stray field created by or originating from each of the first tuning layer 802 and the second tuning layer 804 may then be opposed to the stray field created by or originating from the central fixed magnetic layer structure (pinned layer) 502. Therefore, the stray field of each of the first tuning layer 802 and the second tuning layer 804 may compensate or offset the stray field of the fixed magnetic layer structure 502.

In other words, each of the first tuning layer 802 and the second tuning layer 804 may act as a cancelling layer to offset the relatively large stray field from the fixed magnetic layer structure (polarizer) 502 and adjust the bias field of the first free magnetic layer structure 504 and the second free magnetic layer structure 506 for suitable operation parameters.

In various embodiments, the spacer layers 806, 808 may be thick non-magnetic spacer layers, for tuning the cancelling field by the first tuning layer 802 and the second tuning layer 804 respectively, and minimising or removing any parasitic GMR effects. In various embodiments, any one of or each of the spacer layers 806, 808 may have a thickness of between about 1 nm and about 10 nm, for example between about 1 nm and about 5 nm, between about 1 nm and about 3 nm, between about 3 nm and about 10 nm, or between about 5 nm and about 10 nm.

In various embodiments, the bias field (e.g. magnetic bias field) experienced by each of the first free magnetic layer structure 504 and the second free magnetic layer structure 506 (free layers) may be tuned by either changing the saturation magnetization of any one or each of the additional magnetic layers (e.g. the first tuning layer 802 and the second tuning layer 804), and/or changing the thickness of any one or each of the spacer layers 806, 808.

Figure 9:
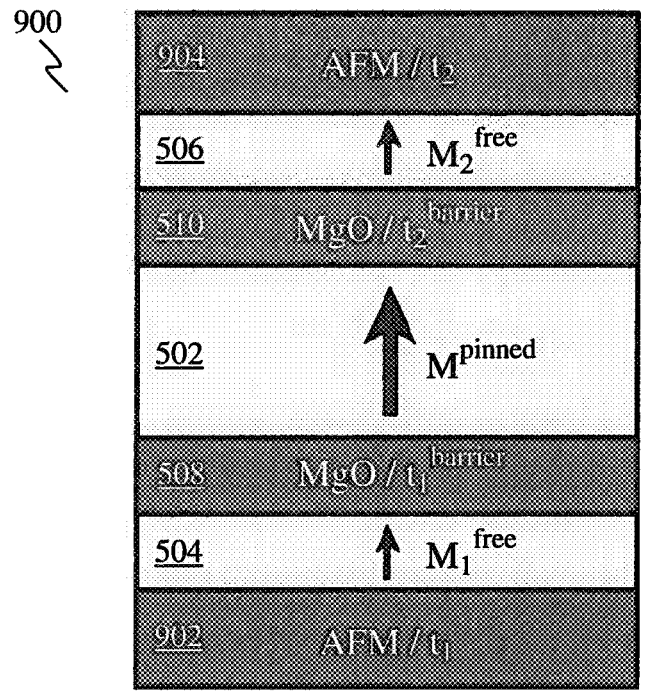
FIG. 9 shows a schematic cross-sectional view of a magnetoresistive device, according to various embodiments.

FIG. 9 shows a schematic cross-sectional view of a magnetoresistive device 900, according to various embodiments. The magnetoresistive device 900 may be a 2-bit per cell magnetic random access memory (MRAM) employing an electric field with spin torque transfer assistance for individual writing of each free layer. The magnetoresistive device 900 may include bias field tuning capability.

The magnetoresistive device 900 may be a tunneling magnetoresistive (TMR) device, e.g. a spin transfer torque magnetic random access memory (STT-MRAM) with perpendicular anisotropy. The magnetoresistive device 900 has a stack structure, having for example a plurality of magnetic or ferromagnetic layers.

The magnetoresistive device 900 may include a fixed magnetic layer structure (a ferromagnetic hard layer) 502, two (2) free magnetic layer structures (ferromagnetic soft layers), e.g. a first free magnetic layer structure 504 and a second free magnetic layer structure 506, arranged one over the other, and spacer layers 508, 510, which may be as described in the context of the embodiment of FIG. 5.

The magnetoresistive device 900 may further include a respective anti-ferromagnetic (AFM) layer arranged on one side of each of the first free magnetic layer structure 504 and the second free magnetic layer structure 506. For example, the magnetoresistive device 800 may further include a first anti-ferromagnetic (AFM) layer 902 arranged on one side of the first free magnetic layer structure 504, for example on the side of the first free magnetic layer structure 504 opposite to the fixed magnetic layer structure 502, and a second antiferromagnetic (AFM) layer 904 arranged on one side of the second free magnetic layer structure 506, for example on the side of the second free magnetic layer structure 506 opposite to the fixed magnetic layer structure 502.

Any one or each of the first anti-ferromagnetic layer 902 and the second anti-ferromagnetic layer 904 may be made from iridium-manganese (IrMn), iron-manganese (FeMn), platinum-manganese (PtMn), or any other conductive anti-ferromagnetic materials.

Therefore, the magnetoresistive device 900 may have a structure that is at least substantially similar to that of the magnetoresistive device 500 of FIG. 5, and further including one anti-ferromagnetic layer predisposed on the other side of each free layer.

The first anti-ferromagnetic layer 902 and the second anti-ferromagnetic layer 904 may have different thicknesses. The thickness, $t_1$, of the first anti-ferromagnetic layer 902 may be between about 1 nm and about 10 nm. The thickness, $t_2$, of the second anti-ferromagnetic layer 904 may be between about 1 nm and about 10 nm.

However, it is not precluded that embodiments of the magnetoresistive device 900 may have the first anti-ferromagnetic layer 902 and the second anti-ferromagnetic layer 904 having the same thickness.

As described, in various embodiments, the criteria for choosing the bias field may be $H_c^V < |H_{bias}| < H_c^0$. For the structure of the magnetoresistive device 900, the criterion may be met by using an anti-ferromagnetic layer to increase $H_c^0$ of the respective free layers, without strongly pinning the respective magnetization orientations of the respective free layers. This may be achieved by using a thin enough anti-ferromagnetic layer such that the exchange bias may be negligible (see FIG. 10), and choosing the anti-ferromagnetic materials in order to ensure that the operating temperature is above the blocking temperature but below the Neel temperature of the antiferromagnetic material. This may also contribute to improve the thermal stability factor of the thin free magnetic layers, by increasing the effective $K_u$ of the free layers.

Figure 10:
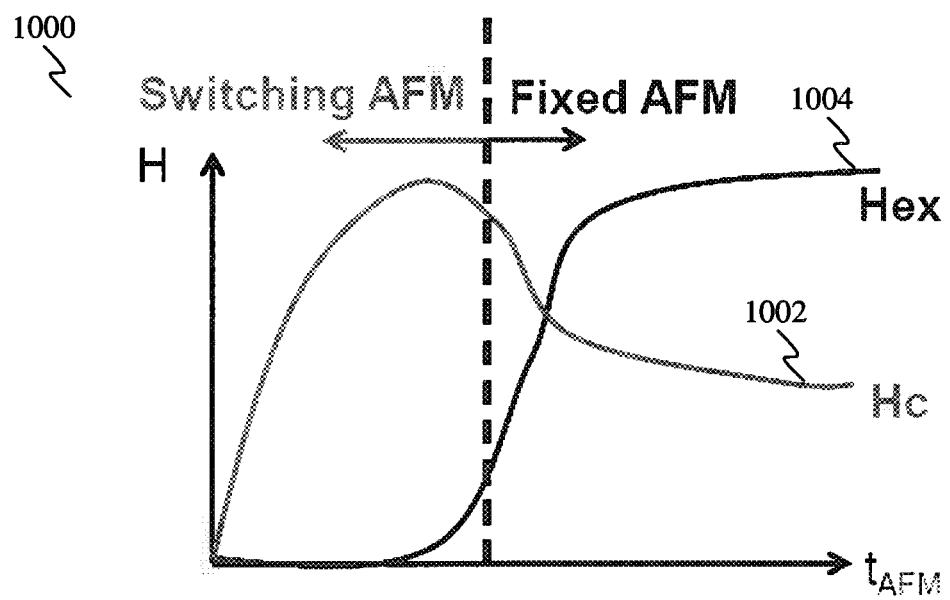
FIG. 10 shows a plot illustrating the effect of the thickness of an anti-ferromagnetic layer on the coercivity of a free magnetic layer structure, according to various embodiments.

As shown in FIG. 10 of the plot 1000 illustrating the effect of the thickness of an anti-ferromagnetic layer on the coercivity of a free magnetic layer structure, the thickness of the anti-ferromagnetic (AFM) layer (e.g. 902 and/or 904) may be chosen such that the coercivity, $H_c$ 1002, of the free layer (e.g. 504 and/or 506) may be increased, without significant exchange field increase such that the free layer may become pinned, or in other words, the respective magnetization orientations of the first free magnetic layer structure 504 and the second free magnetic layer structure 506 may be pinned by the respective first anti-ferromagnetic layer 902 and second anti-ferromagnetic layer 904. Hex represents the shift of the center of the hysteresis loop of a free magnetic layer structure (e.g. 504) adjacent to an AFM material (e.g. 902). If Hex is too strong, it may be very difficult to switch the magnetization of the free magnetic layer structure or FM layer. Furthermore, as illustrated in FIG. 10, if the thickness of the AFM layer is large enough, when the magnetization of the adjacent FM layer switches, the AFM orientation stays constant (fixed AFM). However, if the thickness of the AFM layer is small enough, then the AFM orientation may switch (switching AFM) following the switching of the adjacent FM layer.

Therefore, each of the first anti-ferromagnetic layer 902 and the second anti-ferromagnetic layer 904 may increase the $H_c$ of the respective free layers (the first free magnetic layer structure 504 and the second free magnetic layer structure 506) to satisfy the $H_{bias}$ condition and/or enhance the thermal stability of the free layers.

Figure 11:
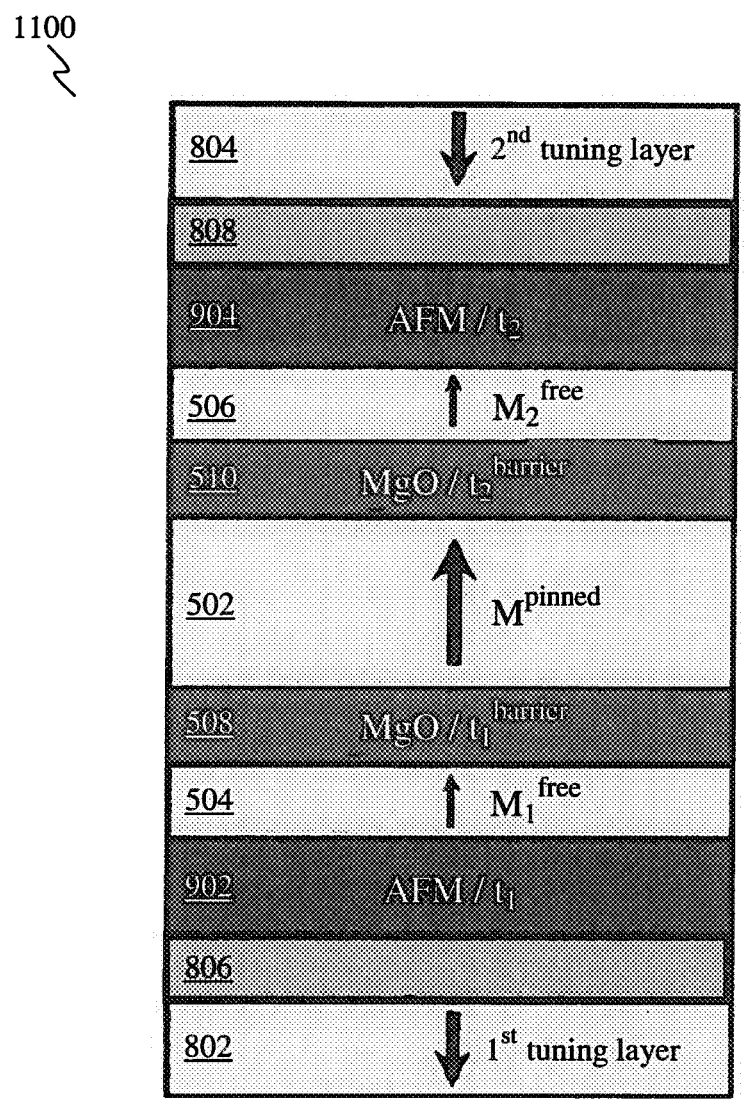
FIG. 11 shows a schematic cross-sectional view of a magnetoresistive device, according to various embodiments.

FIG. 11 shows a schematic cross-sectional view of a magnetoresistive device 1100, according to various embodiments. The magnetoresistive device 1100 may be a 2-bit per cell magnetic random access memory (MRAM) employing an electric field with spin torque transfer assistance for individual writing of each free layer. The magnetoresistive device 1100 may include bias field tuning capability.

The magnetoresistive device 1100 may be a tunneling magnetoresistive (TMR) device, e.g. a spin transfer torque magnetic random access memory (STT-MRAM) with perpendicular anisotropy. The magnetoresistive device 1100 has a stack structure, having for example a plurality of magnetic or ferromagnetic layers.

As illustrated in FIG. 11, the magnetoresistive device 1100 has a structure arrangement which is a hybrid of the structures of the magnetoresistive device 800 (FIG. 8) and the magnetoresistive device 900 (FIG. 9), which includes the features of anti-ferromagnetic tuning (e.g. 902, 904) of the free layers (e.g. 504, 506), and the use of tuning layers (e.g. 802, 804) to operate the device 1100 at a suitable has field (e.g. magnetic bias field).

The magnetoresistive device 1100 may include a fixed magnetic layer structure (a ferromagnetic hard layer) 502, two (2) free magnetic layer structures (ferromagnetic soft layers), e.g. a first free magnetic layer structure 504 and a second free magnetic layer structure 506, spacer layers 508, 510, 806, 808, two (2) tuning layers, e.g. a first tuning layer 802 and a second tuning layer 804, and two (2) anti-ferromagnetic layers, e.g. a first anti-ferromagnetic layer 902 and a second anti-ferromagnetic layer 904, arranged one over the other, which may be as described in the context of the embodiments of FIGS. 5, 8 and 9.

Figure 12:
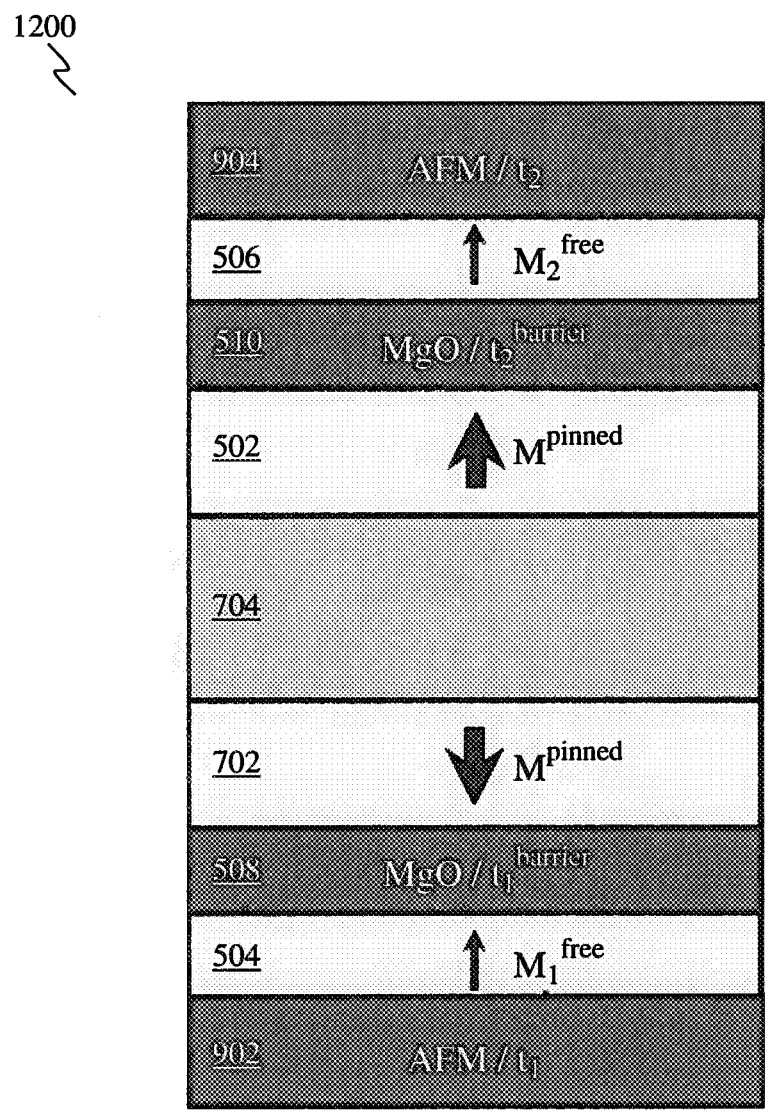
FIG. 12 shows a schematic cross-sectional view of a magnetoresistive device, according to various embodiments.

FIG. 12 shows a schematic cross-sectional view of a magnetoresistive device 1200, according to various embodiments. The magnetoresistive device 1200 may be a 2-bit per cell magnetic random access memory (MRAM) employing an electric field with spin torque transfer assistance for individual writing of each free layer. The magnetoresistive device 1200 may include bias field tuning capability.

The magnetoresistive device 1200 may be a tunneling magnetoresistive (TMR) device, e.g. a spin transfer torque magnetic random access memory (STT-MRAM) with perpendicular anisotropy. The magnetoresistive device 1200 has a stack structure, having for example a plurality of magnetic or ferromagnetic layers.

As illustrated in FIG. 12, the magnetoresistive device 1200 has a structure arrangement which is a hybrid of the structures of the magnetoresistive device 700 (FIG. 7) and the magnetoresistive device 900 (FIG. 9), which includes the features of anti-ferromagnetic tuning (e.g. 902, 904) of the free layers (e.g. 504, 506), and the use of two reference layers (e.g. 502, 702) aligned anti-parallel to each other to operate the device at a suitable bias field (e.g. magnetic bias field).

The magnetoresistive device 1200 may include two (2) fixed magnetic layer structures (ferromagnetic hard layers), e.g. a fixed magnetic layer structure 502 and a second fixed magnetic layer structure 702, two (2) free magnetic layer structures (ferromagnetic soft layers), e.g. a first free magnetic layer structure 504 and a second free magnetic layer structure 506, spacer layers 508, 510, 704, and two (2) anti-ferromagnetic layers, e.g. a first anti-ferromagnetic layer 902 and a second anti-ferromagnetic layer 904, arranged one over the other, which may be as described in the context of the embodiments of FIGS. 5, 7 and 9.

It should be appreciated that the writing method as described in the context of the embodiment of FIG. 6 may be used for any one of the magnetoresistive devices 700, 800, 900, 1100, 1200.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A magnetoresistive device comprising:
   a fixed magnetic layer structure having a fixed magnetization orientation;
   a first free magnetic layer structure having a variable magnetization orientation; and
   a second free magnetic layer structure having a variable magnetization orientation,
   wherein the fixed magnetic layer structure is arranged in between the first free magnetic layer structure and the second free magnetic layer structure,
   wherein the magnetization orientation of the first free magnetic layer structure is variable in response to a first electrical signal of a first polarity and the magnetization orientation of the second free magnetic layer structure is at least substantially non-variable in response to the first electrical signal, wherein the magnetization orientation of the first free magnetic layer structure is variable from a first direction to a second direction different from the first direction in response to the first electrical signal having a first magnitude, and the magnetization orientation of the first free magnetic layer structure is variable from the second direction to the first direction in response to the first electrical signal having a second magnitude different from the first magnitude, and
   wherein the magnetization orientation of the second free magnetic layer structure is variable in response to a second electrical signal of a second polarity and the magnetization orientation of the first free magnetic layer structure is at least substantially non-variable in response to the second electrical signal, wherein the second polarity is opposite to the first polarity.

2. The magnetoresistive device as claimed in claim 1, wherein the magnetization orientation of the second free magnetic layer structure is variable from a first direction to a second direction different from the first direction in response to the second electrical signal having a first magnitude, and the magnetization orientation of the second free magnetic layer structure is variable from the second direction to the first direction in response to the second electrical signal having a second magnitude different from the first magnitude.

3. The magnetoresistive device as claimed in claim 1, wherein the first direction is anti-parallel to the fixed magnetization orientation of the fixed magnetic layer structure, wherein the second direction is parallel to the fixed magnetization orientation of the fixed magnetic layer structure, and wherein the second magnitude is larger than the first magnitude.

4. The magnetoresistive device as claimed in claim 1, wherein the first electrical signal is a first voltage and wherein the second electrical signal is a second voltage.

5. The magnetoresistive device as claimed in claim 1, further comprising:
   a first spacer layer between the first free magnetic layer structure and the fixed magnetic layer structure; and
   a second spacer layer between the second free magnetic layer structure and the fixed magnetic layer structure,
   wherein the first spacer layer and the second spacer layer have different thicknesses.

6. The magnetoresistive device as claimed in claim 5, wherein the thickness of the first spacer layer is between about 0.5 nm and about 2 nm.

7. The magnetoresistive device as claimed in claim 5, wherein the thickness of the second spacer layer is between about 0.5 nm and about 2 nm.

8. The magnetoresistive device as claimed in claim 1, wherein each of the first free magnetic layer structure and the second free magnetic layer structure comprises a material selected from the group consisting of cobalt, iron, nickel, boron, nitrogen, and an alloy comprising at least one of cobalt, iron or nickel.

9. The magnetoresistive device as claimed in claim 1, wherein the fixed magnetic layer structure comprises a single layer comprising an alloy comprising at least one of iron, platinum or palladium, or a bilayer structure comprising a first layer comprising a material selected from the group consisting of cobalt, iron, boron, nickel and cobalt-iron and a second layer comprising a material selected from the group consisting of palladium, platinum and nickel.

10. The magnetoresistive device as claimed in claim 1, further comprising a second fixed magnetic layer structure having a fixed magnetization orientation, wherein the respective magnetization orientations of the fixed magnetic layer structure and the second fixed magnetic layer structure are oriented anti-parallel to each other.

11. The magnetoresistive device as claimed in claim 10, wherein the second fixed magnetic layer structure comprises a single layer comprising an alloy comprising at least one of iron, platinum or palladium, or a bilayer structure comprising a first layer comprising a material selected from the group consisting of cobalt, iron, boron, nickel and cobalt-iron and a second layer comprising a material selected from the group consisting of palladium, platinum and nickel.

12. The magnetoresistive device as claimed in claim 1, further comprising:
    a first tuning layer associated with the first free magnetic layer structure; and
    a second tuning layer associated with the second free magnetic layer structure,
    wherein each of the first tuning layer and the second tuning layer has a magnetization orientation oriented anti-parallel to the magnetization orientation of the fixed magnetic layer structure.

13. The magnetoresistive device as claimed in claim 12, further comprising:
    a spacer layer between the first free magnetic layer structure and the first tuning layer; and
    another spacer layer between the second free magnetic layer structure and the second tuning layer.

14. The magnetoresistive device as claimed in claim 1, further comprising:
    a first anti-ferromagnetic layer associated with the first free magnetic layer structure; and
    a second anti-ferromagnetic layer associated with the second free magnetic layer structure.

15. The magnetoresistive device as claimed in claim 14, wherein each of the first anti-ferromagnetic layer and the second anti-ferromagnetic layer comprises a material comprising X-manganese or X—Y-manganese, wherein each of X and Y is selected from the group consisting of platinum, palladium, iridium, rhodium and ruthenium.

16. The magnetoresistive device as claimed in claim 14, wherein the first anti-ferromagnetic layer and the second anti-ferromagnetic layer have different thicknesses.

17. A writing method for a magnetoresistive device comprising a fixed magnetic layer structure, a first free magnetic layer structure and a second free magnetic layer structure, the method comprising:
applying a first electrical signal of a first polarity for varying a magnetization orientation of the first free magnetic layer structure, wherein a magnetization orientation of the second free magnetic layer structure is at least substantially non-variable in response to the first electrical signal,
wherein applying a first electrical signal of a first polarity comprises applying the first electrical signal having a first magnitude to change the magnetization orientation of the first free magnetic layer structure from a first direction to a second direction different from the first direction, and applying the first electrical signal having a second magnitude different from the first magnitude to change the magnetization orientation of the first free magnetic layer structure from the second direction to the first direction; and
applying a second electrical signal of a second polarity for varying a magnetization orientation of the second free magnetic layer structure, wherein the second polarity is opposite to the first polarity, and wherein a magnetization orientation of the first free magnetic layer structure is at least substantially non-variable in response to the second electrical signal.

18. The writing method as claimed in claim 17, wherein applying a second electrical signal of a second polarity comprises applying the second electrical signal having a first magnitude to change the magnetization orientation of the second free magnetic layer structure from a first direction to a second direction different from the first direction, and applying the second electrical signal having a second magnitude different from the first magnitude to change the magnetization orientation of the second free magnetic layer structure from the second direction to the first direction.

* * * * *